(12) United States Patent
Hashimoto et al.

(10) Patent No.: US 11,430,673 B2
(45) Date of Patent: Aug. 30, 2022

(54) SUBSTRATE PROCESSING APPARATUS AND SUBSTRATE PROCESSING METHOD

(71) Applicant: Tokyo Electron Limited, Tokyo (JP)

(72) Inventors: Yusuke Hashimoto, Kumamoto (JP); Jiro Higashijima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/230,120

(22) Filed: Apr. 14, 2021

(65) Prior Publication Data

US 2021/0327728 A1     Oct. 21, 2021

(30) Foreign Application Priority Data

Apr. 20, 2020   (JP) .............................. JP2020-074920

(51) Int. Cl.
*H01L 21/67*     (2006.01)
*B08B 3/10*      (2006.01)
*B08B 3/08*      (2006.01)
*G03F 7/42*      (2006.01)

(52) U.S. Cl.
CPC .......... *H01L 21/67051* (2013.01); *B08B 3/08* (2013.01); *B08B 3/10* (2013.01); *G03F 7/42* (2013.01)

(58) Field of Classification Search
CPC ......... H01L 21/67051; H01L 21/67253; H01L 21/6708; H01L 21/30604; H01L 21/6715; H01L 21/67288; B08B 3/08; B08B 3/10; G03F 7/42; G03F 7/422; B05C 11/02; B05D 1/40
See application file for complete search history.

(56) References Cited

U.S. PATENT DOCUMENTS

| | | | | |
|---|---|---|---|---|
| 2003/0141201 | A1* | 7/2003 | Basol ....................... | C25F 3/14 205/660 |
| 2003/0178047 | A1* | 9/2003 | Hirae ....................... | B08B 3/02 134/103.3 |
| 2004/0059455 | A1* | 3/2004 | Kawahara ............... | H05K 3/125 700/123 |
| 2005/0247330 | A1* | 11/2005 | Land ....................... | A47L 13/26 340/603 |
| 2006/0231119 | A1* | 10/2006 | Yi ............................ | B08B 3/10 134/1 |

(Continued)

FOREIGN PATENT DOCUMENTS

JP    2013-207080 A    10/2013

*Primary Examiner* — Erin F Bergner
(74) *Attorney, Agent, or Firm* — Armstrong Teasdale LLP

(57) ABSTRACT

A substrate processing apparatus includes at least one nozzle unit configured to eject a processing liquid to a substrate. The at least one nozzle unit includes a conductive part for voltage application configured to be brought into contact with the processing liquid, and a voltage detection part or a current detection part configured to be brought into contact with the processing liquid. A non-conductive part is interposed between the conductive part for voltage application and the voltage detection part or between the conductive part for voltage application and the current detection part. A voltage application part is connected to the conductive part for voltage application, and a voltage detector is installed in the voltage detection part or a current detector is installed in the current detection part.

18 Claims, 18 Drawing Sheets

(56) References Cited

U.S. PATENT DOCUMENTS

| | | | | |
|---|---|---|---|---|
| 2006/0249182 A1* | 11/2006 | Hayamizu | ............... | B08B 3/02 |
| | | | | 134/1 |
| 2008/0173327 A1* | 7/2008 | Miyagi | ............... | B05B 7/0433 |
| | | | | 204/661 |
| 2010/0098590 A1* | 4/2010 | Inamura | ............ | G01N 35/1016 |
| | | | | 324/663 |
| 2012/0031523 A1* | 2/2012 | Bertoni | ............... | B67D 1/1238 |
| | | | | 141/1 |
| 2014/0030167 A1* | 1/2014 | Yamashita | ........... | B01L 3/0227 |
| | | | | 422/509 |
| 2017/0059996 A1* | 3/2017 | Higashijima | ........... | G03F 7/423 |
| 2017/0301573 A1* | 10/2017 | Shibuya | ................. | B24B 37/04 |
| 2021/0043467 A1* | 2/2021 | Hashimoto | ......... | H01L 21/6708 |

* cited by examiner

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2020-074920, filed on Apr. 20, 2020, the entire contents of which are incorporated herein by reference.

TECHNICAL FIELD

The present disclosure relates to a substrate processing apparatus and a substrate processing method.

BACKGROUND

In a semiconductor device manufacturing process, processing, such as an etching process, ion implantation, or the like, is performed using a resist formed on a substrate as a mask. Thereafter, the resist that becomes unnecessary is removed from the substrate.

As a method of removing a resist, there is known an SPM processing, in which a resist is removed by supplying a processing liquid, such as a sulfuric acid hydrogen peroxide mixture (SPM) which is a mixed liquid of sulfuric acid and hydrogen peroxide solution, to a substrate. The SPM is supplied from a nozzle unit to the substrate in a state of being heated to a high temperature so as to enhance the ability to remove the resist (see, for example, Patent Document 1).

PRIOR ART DOCUMENT

Patent Document

Patent Document 1: Japanese Laid-Open Patent Publication No. 2013-207080

SUMMARY

An aspect of the present disclosure provides a substrate processing apparatus including: at least one nozzle unit configured to eject a processing liquid to a substrate, wherein the at least one nozzle unit includes a conductive part for voltage application configured to be brought into contact with the processing liquid, and a voltage detection part or a current detection part configured to be brought into contact with the processing liquid, wherein a non-conductive part is interposed between the conductive part for voltage application and the voltage detection part or between the conductive part for voltage application and the current detection part, and wherein a voltage application part is connected to the conductive part for voltage application, and a voltage detector is installed in the voltage detection part or a current detector is installed in the current detection part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Hereinafter, a first embodiment of a substrate processing apparatus disclosed herein will be described in detail with reference to the accompanying drawings. The present disclosure is not limited to the embodiments described below.

Hereinbelow, a case in which a processing liquid is a sulfuric acid hydrogen peroxide mixture (SPM), which is a mixed liquid of sulfuric acid and hydrogen peroxide solution, will be described as an example.

Figure 1:
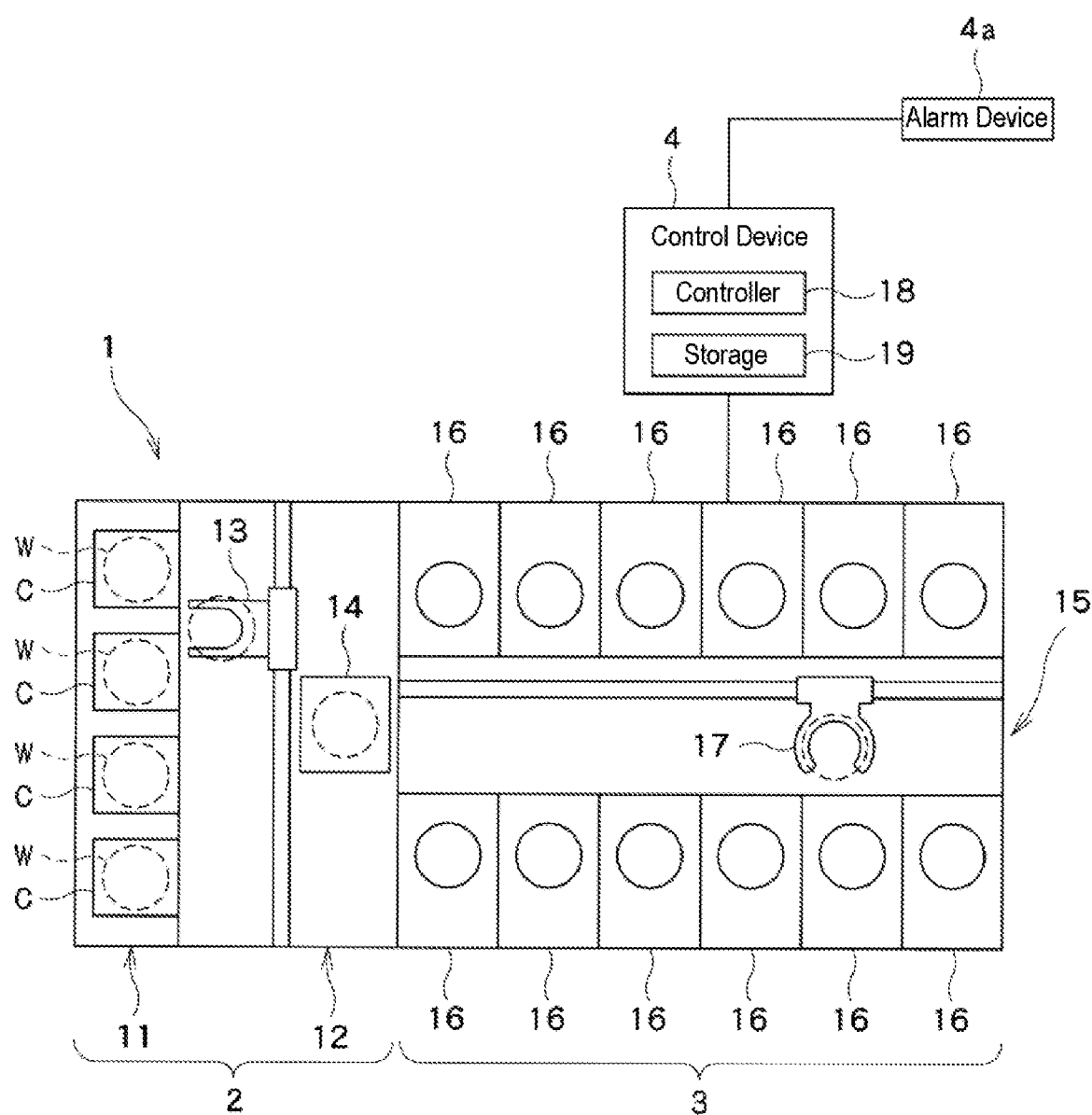
FIG. 1 is a view illustrating a schematic configuration of a substrate processing system according to a first embodiment.

FIG. 1 is a view illustrating a schematic configuration of a substrate processing system according to the present embodiment. In the following description, in order to clarify positional relationships, an X-axis, a Y-axis, and a Z-axis, which are orthogonal to one another, are defined, and the positive direction of the Z-axis is defined as a vertically upward direction.

As illustrated in FIG. 1, a substrate processing system 1 includes a loading and unloading station 2 and a processing station 3. The loading and unloading station 2 and the processing station 3 are provided adjacent to each other.

The loading and unloading station 2 includes a carrier stage 11 and a transfer part 12. A plurality of carriers C that accommodate a plurality of substrates, for example, semiconductor wafers W (hereinafter, referred to as "wafers W"), horizontally is placed on the carrier stage 11.

The transfer part 12 is provided adjacent to the carrier stage 11, and includes therein a substrate transfer device 13 and a delivery part 14. The substrate transfer device 13 includes a wafer holding mechanism configured to hold the wafer W. In addition, the substrate transfer device 13 can move in a horizontal direction and in a vertical direction, and can rotate about a vertical axis. Thus, the substrate transfer device 13 transfers the wafers W between the carriers C and the delivery part 14 by using the wafer holding mechanism.

The processing station 3 is provided adjacent to the transfer part 12. The processing station 3 includes a transfer part 15 and a plurality of processing units (substrate processing apparatuses according to the present disclosure) 16. The processing units 16 are arranged side by side on opposite sides of the transfer part 15.

The transfer part 15 includes therein a substrate transfer device 17. The substrate transfer device 17 includes a wafer holding mechanism configured to hold a wafer W. In addition, the substrate transfer device 17 can move in the horizontal direction and in the vertical direction, and can rotate about a vertical axis. Thus, the substrate transfer device 17 transfers the wafer W between the delivery part 14 and the processing units 16 by using the wafer holding mechanism.

Each of the processing units 16 performs a predetermined substrate processing on the wafer W transferred thereto by the substrate transfer device 17.

In addition, the substrate processing system 1 includes a control device 4. The control device 4 includes, for example, a computer, and is provided with a controller 18 and a storage 19. The storage 19 stores programs for controlling various processes executed in the substrate processing system 1. The controller 18 controls operations of the substrate processing system 1 by reading and executing the programs stored in the storage 19.

In addition, the programs may be stored in a non-transitory computer-readable storage medium, and may be installed in the storage 19 of the control device 4 from the storage medium. Examples of the computer-readable storage medium include a hard disk (HD), a flexible disk (FD), a compact disk (CD), a magneto-optical disk (MO), and a memory card.

In the substrate processing system 1 configured as described above, first, the substrate transfer device 13 of the loading and unloading station 2 takes out a wafer W from the carrier C placed on the carrier stage 11 and places the wafer W, which has been taken out, on the delivery part 14. The wafer W placed on the delivery part 14 is taken out from the delivery part 14 by the substrate transfer device 17 in the processing station 3, and is loaded into a processing unit 16.

The wafer W loaded into the processing unit 16 is processed by the processing unit 16. Thereafter, the wafer W is unloaded from the processing unit 16 and placed on the delivery part 14 by the substrate transfer device 17. Then, the wafer W, which has been processed and placed on the delivery part 14, is returned to the carrier C in the carrier stage 11 by the substrate transfer device 13.

Figure 2:
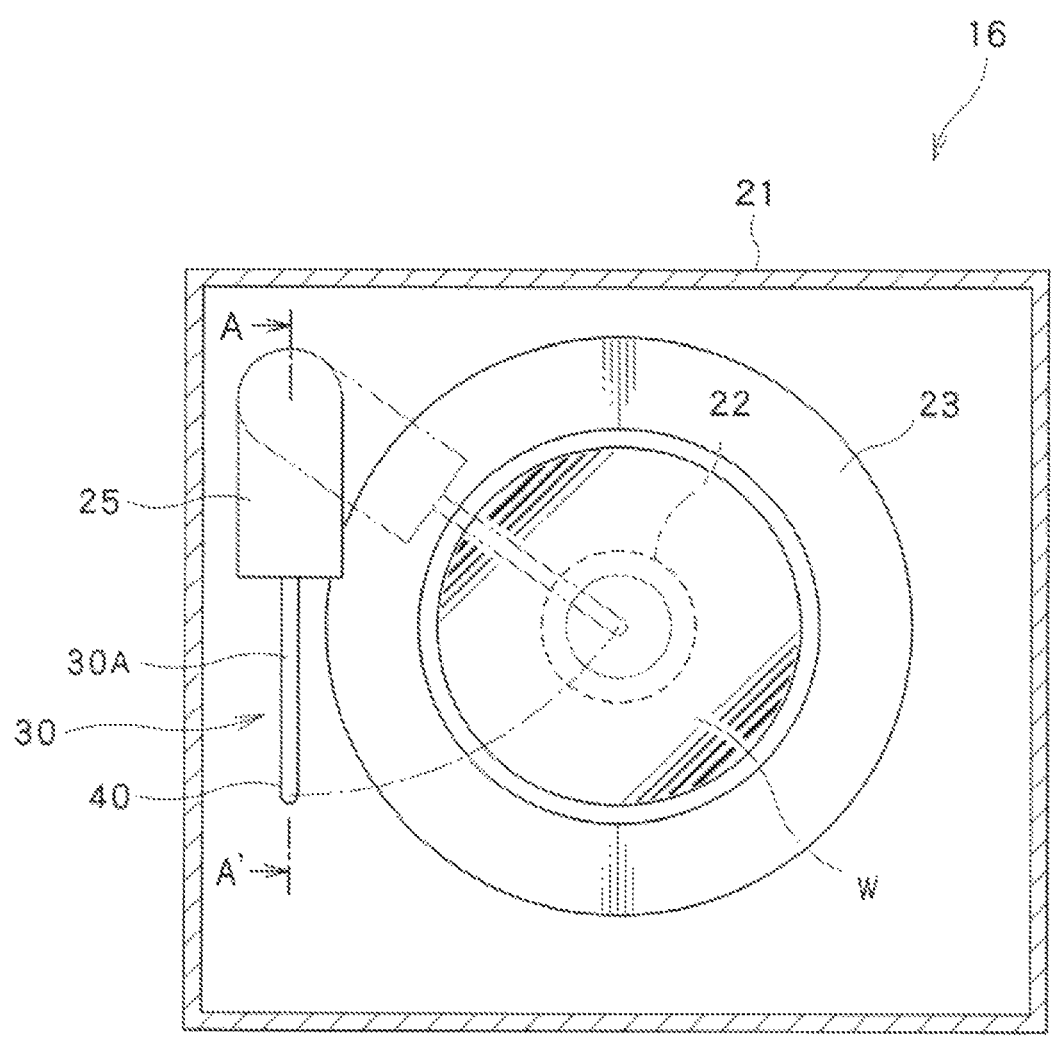
FIG. 2 is a schematic plan view illustrating a configuration of a processing unit (a substrate processing apparatus).
Figure 6:
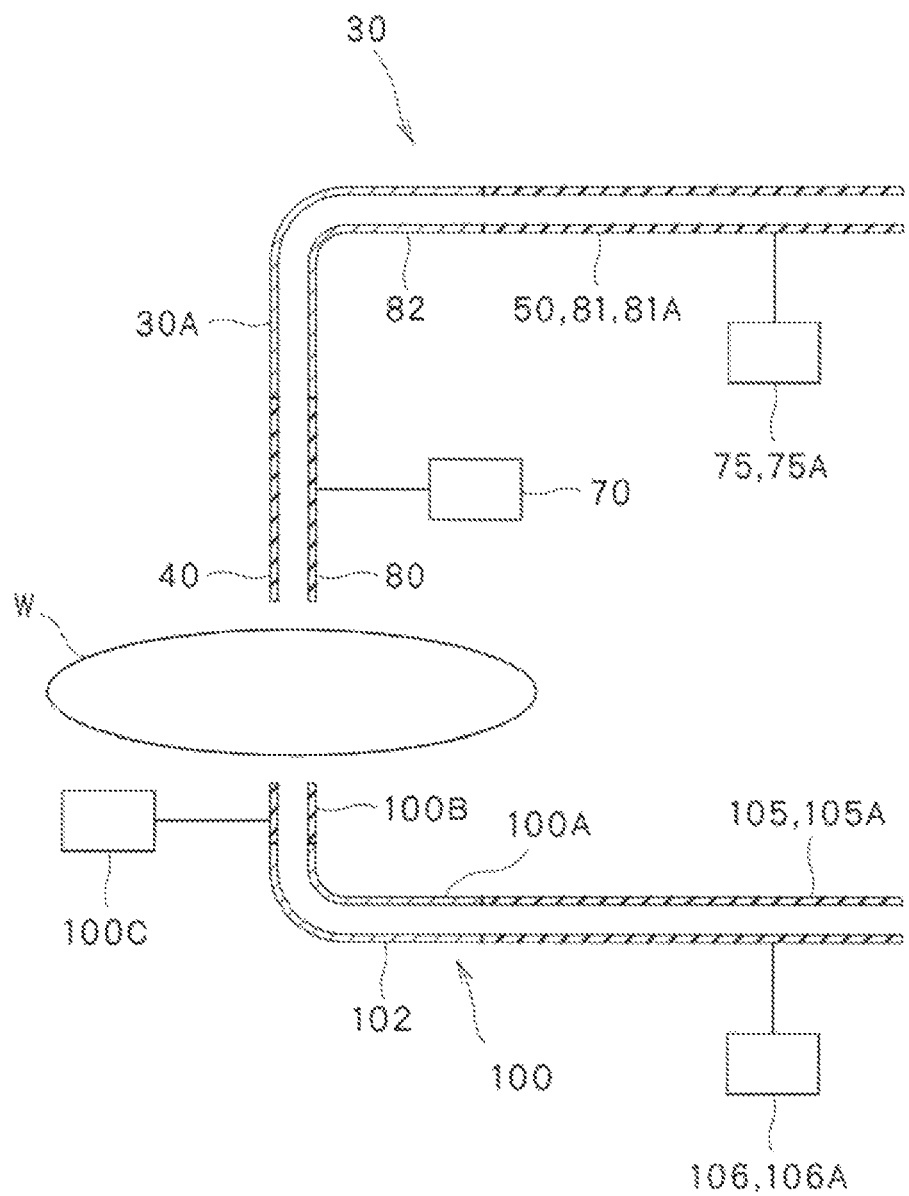
FIG. 6 is a schematic view illustrating a substrate processing apparatus according to the first embodiment.

Next, a schematic configuration of the processing unit 16 (a substrate processing apparatus according to the present disclosure) will be described with reference to FIGS. 2 and 6. FIG. 2 is a schematic plan view illustrating a configuration of the processing unit 16. FIG. 6 is a schematic view illustrating a processing liquid supply system in the processing unit 16 as the substrate processing apparatus.

As illustrated in FIG. 2, the processing unit (substrate processing apparatus) 16 includes a chamber 21, a substrate holding mechanism 22 disposed in the chamber 21 and rotatably holding the wafer W, a recovery cup 23, and a nozzle unit 30 configured to eject a processing liquid onto the wafer W.

Among the components described above, the substrate holding mechanism 22 holds the wafer W horizontally and rotates the held wafer W around a vertical axis. The recovery cup 23 is disposed so as to surround the substrate holding mechanism 22, and receives and recovers the processing liquid scattered to the outside of the wafer W due to a centrifugal force accompanying a rotation of the wafer W.

The nozzle unit 30 is disposed in the chamber 21 and supplies the processing liquid toward the wafer W from above the wafer W. The nozzle unit 30 includes a pipe 30A configured to supply the processing liquid, a nozzle tip 40 provided at a tip end of the pipe 30A and configured to eject the processing liquid toward the wafer W, and a nozzle support 25 configured to hold the pipe 30A of the nozzle unit 30. The nozzle support 25 is configured to be capable of moving vertically and capable of rotating.

Next, a liquid supply system will be described with reference to FIG. 6. The nozzle unit (also referred to as a "front-surface-side nozzle unit") 30 installed in the processing unit 16 supplies the processing liquid toward a front surface of the wafer W from above the wafer W.

In addition, the processing unit 16 includes a nozzle unit (also referred to as a "rear-surface-side nozzle unit") 100 configured to supply the processing liquid toward a rear surface of the wafer from below the wafer W.

As described above, the front-surface-side nozzle unit 30 includes the pipe 30A, and the nozzle tip 40 provided at the tip end of the pipe 30A and configured to eject the processing liquid toward the front surface of the wafer W. Similarly, the rear-surface-side nozzle unit 100 includes a pipe 100A, and a nozzle tip 100B provided at a tip end of the pipe 100A and configured to eject the processing liquid toward the rear surface of the wafer W. In addition, the nozzle tip 40 of the nozzle unit 30 functions as a conductive part 80 for voltage application, and a voltage application part 70 is connected to the nozzle tip 40.

In addition, a voltage detection part 81 is provided on a side of a base end of the nozzle unit 30, and a voltage detector 75 is connected to the voltage detection part 81. Further, a non-conductive part 82 is interposed between the conductive part 80 for voltage application and the voltage detection part 81.

In addition, the nozzle tip 100B of the nozzle unit 100 functions as a conductive part for voltage application, and a voltage application part 100C is connected to the nozzle tip 100B.

In addition, a voltage detection part 105 is provided on a side of a base end of the nozzle unit 100, and a voltage detector 106 is connected to the voltage detection part 105. Further, a non-conductive part 102 is interposed between the conductive part 100B for voltage application and the voltage detection part 105.

The front-surface-side nozzle unit 30 and the rear-surface-side nozzle unit 100 supply the processing liquid toward the front surface and the rear surface of the wafer W, respectively. In addition, the number of each of the front-surface-side nozzle unit 30 and the rear-surface-side nozzle unit 100 is not limited to one, and a plurality of front-surface-side nozzle units 30 and a plurality of rear-surface-side nozzle units 100 may be installed.

In the present embodiment, between the front-surface-side nozzle unit 30 and the rear-surface-side nozzle unit 100, the front-surface-side nozzle unit 30 will be mainly described. However, the rear-surface-side nozzle unit 100 also has substantially the same structure as that of the front-surface-side nozzle unit 30.

Hereinafter, a structure of the nozzle unit 30 will be described in detail with reference to FIG. 2 and FIGS. 3A to 3C.

As illustrated in FIG. 2 and FIGS. 3A to 3C, the nozzle unit 30 includes the pipe 30A configured to supply the processing liquid, the nozzle tip 40 provided at the tip end of the pipe 30A, and the nozzle support 25 configured to support the pipe 30A such that the pipe 30A can move vertically and rotate. Thus, the nozzle unit 30 is configured to eject the SPM toward the wafer W.

Here, when the SPM is used for removing, for example, a resist, the SPM is ejected from the nozzle tip 40 toward the wafer W at a high temperature of about 160 degrees C.

The nozzle unit 30 will be further described. The pipe 30A of the nozzle unit 30 is substantially L-shaped in a side view, and includes a first layer 31 formed of a corrosion-resistant resin, a second layer 32 formed of a rigid material, and a third layer 33 formed of a corrosion-resistant resin, which are arranged in order from the inside. In addition, the nozzle tip 40 of the nozzle unit 30 is configured separately from the pipe 30A, and is formed of a conductive corrosion-resistant resin fitted into the tip end of the pipe 30A.

Specifically, as the first layer 31 of the pipe 30A, a thermoplastic material having chemical resistance and heat resistance to the SPM, for example, a tetrafluoroethylene-perfluoroalkyl vinyl ether (PFA) tube having a conductive outer surface, may be used.

Further, as the second layer 32, a stainless steel (SUS) tube that functions as a framework for maintaining rigidity of the pipe 30A and has conductivity may be used.

Further, as the third layer 33, a thermoplastic material having chemical resistance and heat resistance to the SPM, for example, a PFA tube, may be used.

Further, the nozzle tip 40 may be formed of a conductive PFA material.

Figure 3A:
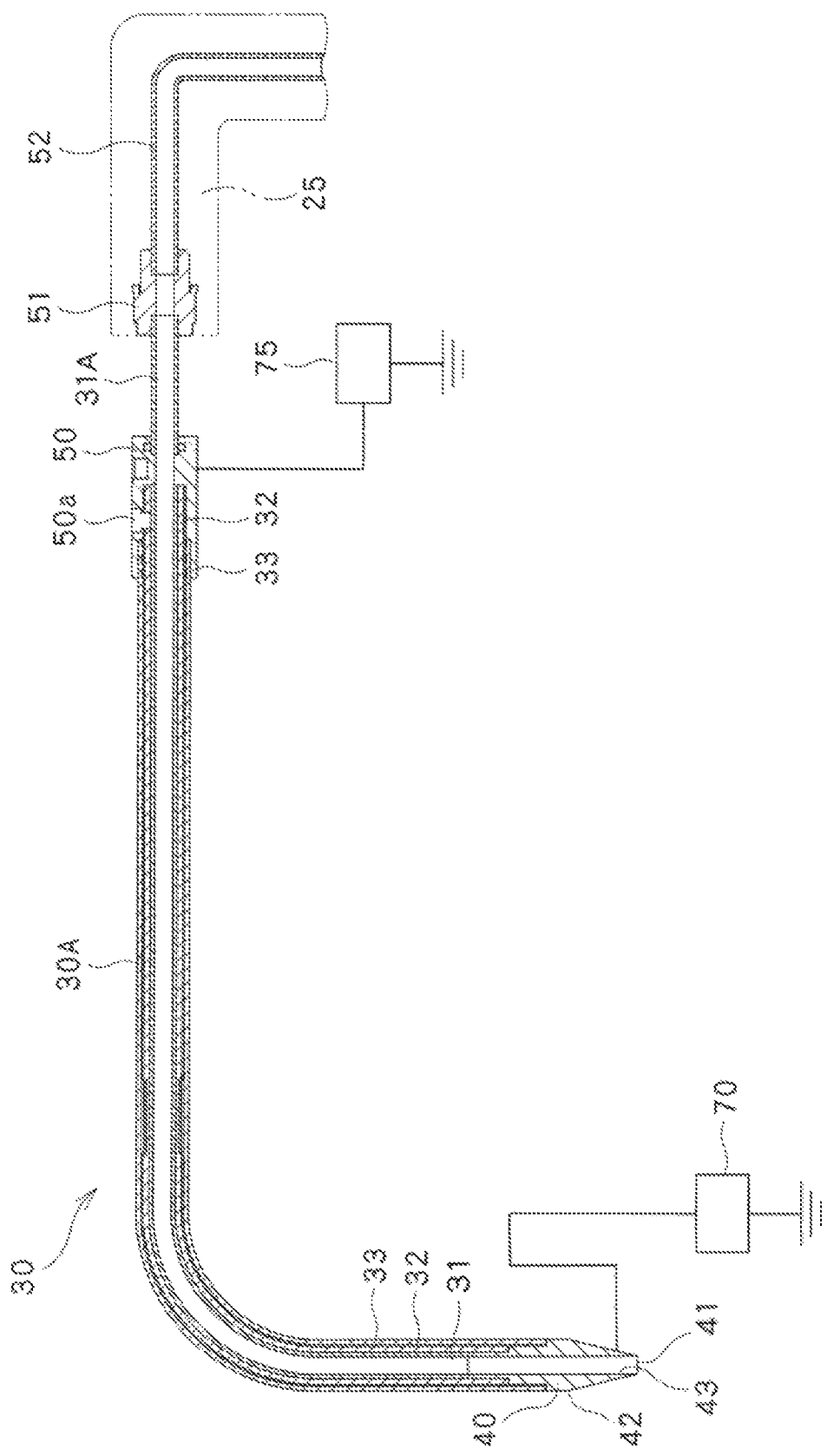
FIG. 3A is a side cross-sectional view illustrating a nozzle unit according to the first embodiment, taken along the line A-A' in FIG. 2.
Figure 3B:
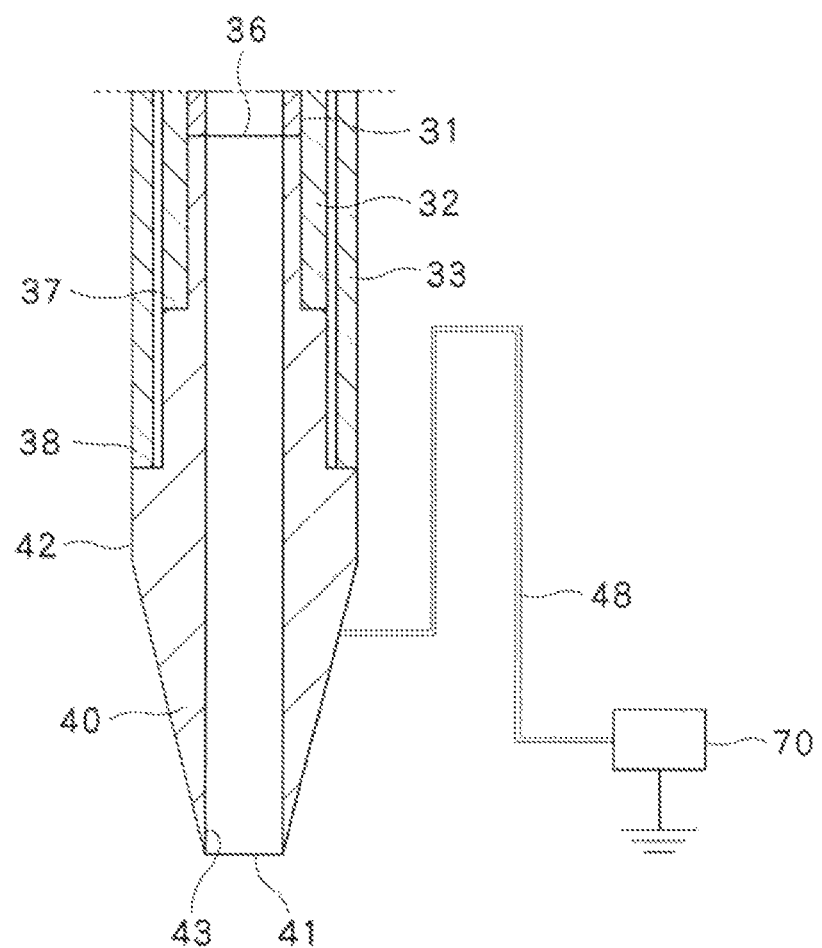
FIG. 3B is an enlarged view illustrating a vicinity of a nozzle tip.
Figure 3C:
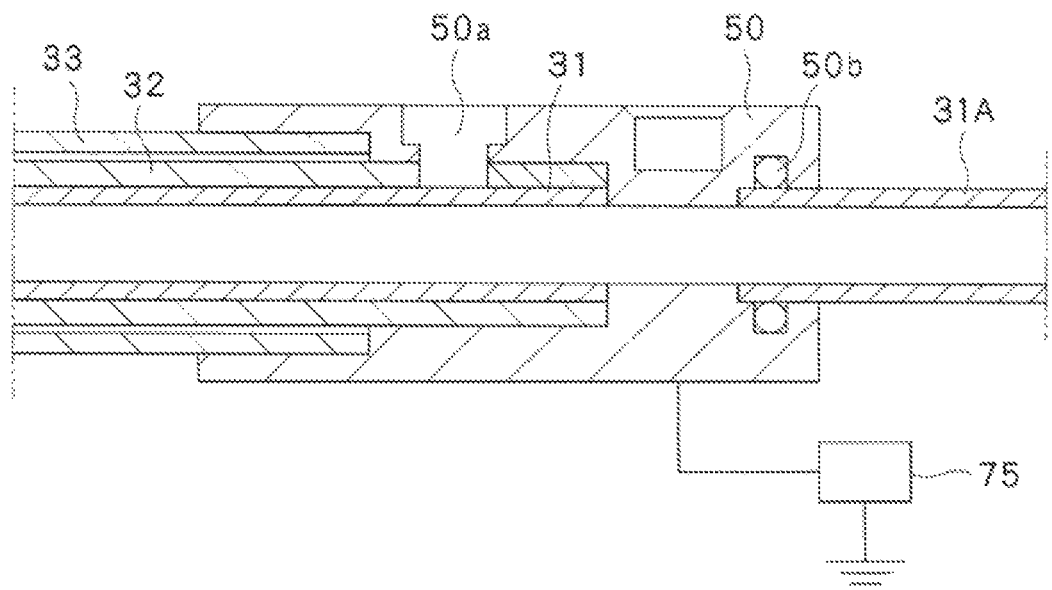
FIG. 3C is an enlarged view illustrating a vicinity of a conductor.

As illustrated in FIGS. 3A to 3C, the nozzle unit 30 further includes a conductor 50, which is provided on a side of a base end of the pipe 30A and formed of a conductive material such as a conductive PFA material, and a conductive joint 51 formed of, for example, a conductive PFA material, is attached to the base end of the pipe 30A. Further, the pipe 30A is inserted into the nozzle support 25 via the conductive joint 51 attached to the base end thereof. In this case, the nozzle support 25 is conductive, and the pipe 30A is detachably inserted into the conductive nozzle support 25 via the joint 51. Therefore, the pipe 30A and the nozzle tip 40 can be easily replaced by inserting a new pipe 30A and a new nozzle tip 40 into the nozzle support 25.

The conductor 50 provided on the side of the base end of the pipe 30A seals and covers the pipe 30A from the outside. In addition, a portion of the second layer 32 of the pipe 30A covered with the conductor 50 is removed, and an installation member 50a for installing the conductor 50 to the pipe 30A is provided on the portion of the pipe 30A from which the second layer 32 is removed.

Thus, in the portion of the pipe 30A covered with the conductor 50, the outer surface of the conductive first layer 31 of the pipe 30A is in electrical conduction with the conductor 50.

In this case, as illustrated in FIGS. 3A and 3C, the first layer 31 of the pipe 30A penetrates the conductor 50, passes the installation member 50a in the right-hand side direction within the conductor 50, and terminates in a place facing the right-hand side direction in FIG. 3C.

In addition, the second layer 32 extends in the conductor 50 toward the side of the base end (the right-hand side in FIG. 3A) of the pipe 30A and, like the first layer 31, passes the installation member 50a in the right-hand side direction within the conductor 50, and terminates in a place facing the right-hand side direction in FIG. 3C.

In addition, as illustrated in FIGS. 3A and 3C, an additional first layer 31A is inserted into an end portion of the conductor 50 on the right-hand side, and the conductor 50 and the additional first layer 31A are sealed by a seal 50b.

As will be described later, each of the first layer 31 and the additional first layer 31A has a tubular main body 31a, which is formed of PFA and has a conductive outer surface and a non-conductive inner surface. Therefore, although the inner surfaces of the first layer 31 and the additional first layer 31A are brought into contact with the processing liquid, since the inner surfaces of the first layer 31 and the additional first layer 31A are electrically non-conductive, the first layer 31 and the additional first layer 31A form the non-conductive part 82 of the nozzle unit 30. Further, the conductor 50, which is brought into contact with the processing liquid, exists between the first layer 31 and the additional first layer 31A, and functions as the conductive voltage detection part 81. Furthermore, the voltage detector 75 is connected to the conductor 50, which functions as the voltage detection part 81.

In addition, the third layer 33 extends in the conductor 50 toward the side of the base end (the right-hand side in FIG. 3A) of the pipe 30A, and terminates in front of the installation member 50a (the left-hand side in FIG. 3C) within the conductor 50.

Figure 5A:
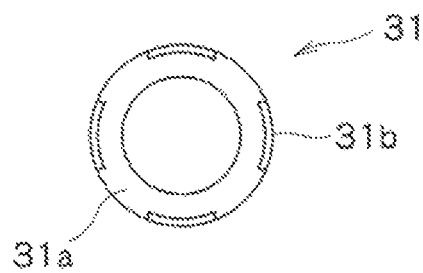
FIG. 5A is a cross-sectional view illustrating an example of a first layer.

Next, materials and structures of the first to third layers 31 to 33 of the pipe 30A and the nozzle tip 40 will be further described. The first layer 31 and the additional first layer 31A of the pipe 30A have substantially the same structure. That is, each of the first layer 31 and the additional first layer 31A is formed of a PFA tube having a conductive outer surface and a non-conductive inner surface. For example, a non-explosion (NE)-type PFA tube illustrated in FIG. 5A may be used. Each of the first layer 31 and the additional first layer 31A configured by the NE-type PFA tube includes the non-conductive tubular main body 31a formed of PFA, and four conductive portions 31b which are formed of carbon and provided on the outer surface of the non-conductive tubular main body 31a formed of PFA so as to extend in a longitudinal direction of the tubular main body 31a. The four conductive portions 31b are provided on the outer surface of the tubular main body 31a at intervals of 90 degrees in a circumferential direction. Therefore, the first layer 31 and the additional first layer 31A are conductive on the outer surface thereof in the longitudinal direction.

The second layer 32 is formed of a SUS tube as described above, and the entirety of the second layer 32 is conductive.

The third layer 33 is formed of a PFA tube as described above, and has chemical resistance and heat resistance to the SPM, but is not conductive. However, the third layer 33 is not limited thereto. The third layer 33 may be formed of a PFA tube, and may also have conductivity, in addition to chemical resistance and heat resistance to the SPM. In this case, in addition to the first layer 31 and the second layer 32, the third layer 33 may also release electric charge in the processing liquid to the outside.

The nozzle tip 40 is fitted into the side of the tip end of the pipe 30A, and is basically provided separately from the pipe 30A.

A tip end 41 of the nozzle tip 40 faces a side of the wafer W. In addition, as will be described later, since at least the inner surface of the nozzle tip 40 is conductive from the tip end 41 toward the pipe 30A, it is possible to remove electricity in the processing liquid ejected from the tip end 41 of the nozzle tip 40 toward the wafer W so as to reliably prevent the processing liquid ejected toward the wafer W from being charged.

Figure 5B:
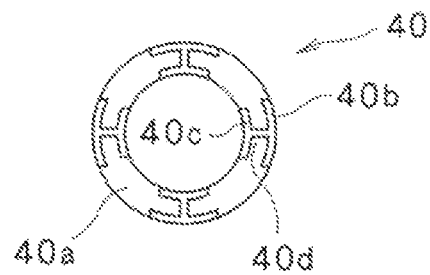
FIG. 5B is a cross-sectional view illustrating an example of the nozzle tip.

The nozzle tip 40 is formed of a conductive PFA material and as illustrated, for example, in FIG. 5B, an anti-static (AS)-type PFA material may be used. Specifically, as illustrated in FIG. 5B, the nozzle tip 40 includes a cylindrical main body 40A formed of PFA, four conductive portions 40b which are formed of carbon and provided on an outer surface 42 of the main body 40a so as to extend in a longitudinal direction of the main body 40a formed of PFA, and four conductive portions 40c which are formed of carbon and provided on an inner surface 43 of the main body 40a so as to extend in the longitudinal direction of the main body 40a.

In this case, the four conductive portions 40b are provided on the outer surface 42 of the main body 40a at intervals of 90 degrees in a circumferential direction, and the four conductive portions 40c are provided on the inner surface 43 of the main body 40a at intervals of 90 degrees in the circumferential direction. Each of the conductive portions 40b of the nozzle tip 40 is provided at the same location in the circumferential direction as that of a corresponding one of the conductive portions 40c, and each of the conductive portions 40b is connected to the corresponding one of the conductive portions 40c via an electrical connector 40d provided so as to penetrate the main body 40a.

Therefore, the nozzle tip 40 has chemical resistance and heat resistance, and are conductive in the longitudinal direction thereof while the inner surface 43 and the outer surface 42 of the nozzle tip 40 are in electrical conduction with each other.

As illustrated in FIG. 3B, the nozzle tip 40 is fitted into the tip end of the pipe 30A. In this case, a tip end of the first layer 31 of the pipe 30A abuts a base end of the nozzle tip 40. Further, the tip of the first layer 31 and the base end of the nozzle tip 40 are joined to each other by welding so as to form a joint portion 36. Thus, the first layer 31 having the conductive outer surface and the nozzle tip 40 having the conductive outer surface can be conductive with each other via the joint portion 36.

In addition, a tip end of the second layer 32 of the pipe 30A extends to the vicinity of a middle of the nozzle tip 40 such that a joint portion 37 is formed between the second layer 32 and the nozzle tip 40. Thus, the second layer 32 and the nozzle tip 40 having the conductive outer surface can be in electrical conduction with each other.

In addition, a tip end of the third layer 33 of the pipe 30A further extends from the second layer 32 to a side of the tip end of the nozzle tip 40, and the tip end of the third layer 33 and the nozzle tip 40 are joined by welding so as to form a joint portion 38.

In FIG. 3B, the nozzle tip 40 having the conductive inner surface is in electrical conduction with the processing liquid passing through the inner surface thereof. At the same time, the nozzle tip 40 having the conductive outer surface can be in electrical conduction with the outer surface of the first layer 31 via the joint portion 36. In addition, the nozzle tip 40 can be in electrical conduction with the second layer 32 on the outer surface thereof.

Figure 3D:
FIG. 3D is a cross-sectional view illustrating a lead wire.
Figure 4:
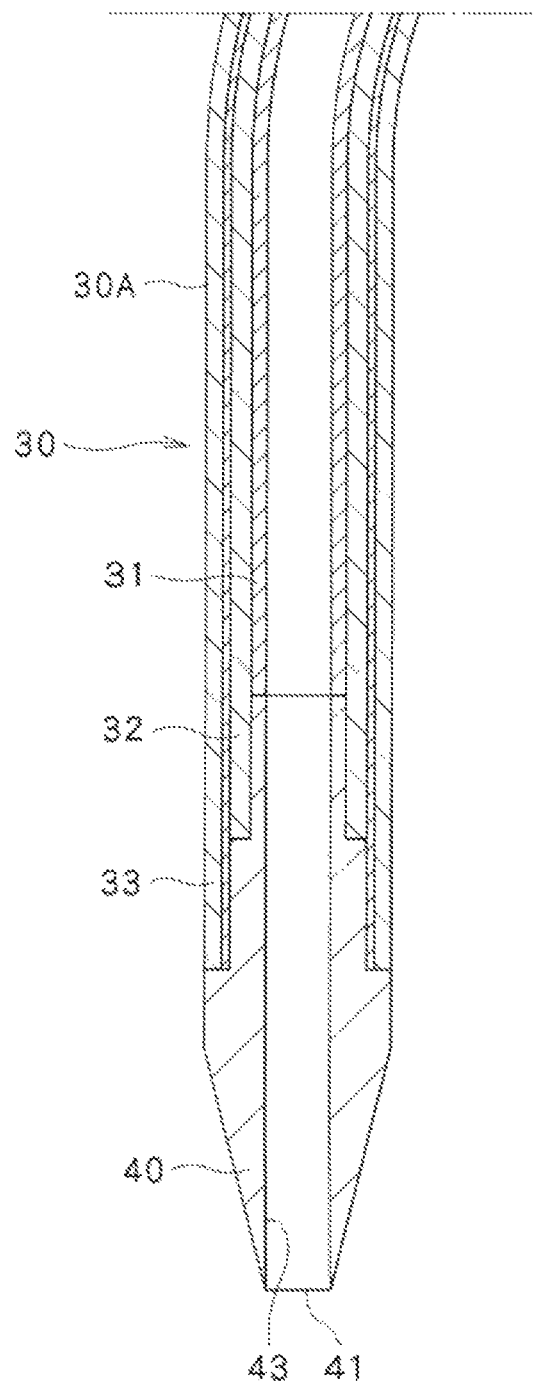
FIG. 4 is an enlarged view illustrating a tip end portion of the nozzle unit.

A lead wire 48 is connected to the outer surface of the nozzle tip 40 and, as shown in FIG. 3D, the lead wire 48 has a metal wire (a copper wire) 48a and a chemical-resistant protective layer 48b, which protects the metal wire 48a from the processing liquid.

The lead wire 48 is directly connected to the nozzle tip 40, extends along the pipe 30A, and is connected to the voltage application part 70 including a DC power supply. Further, the voltage application part 70 is grounded.

In addition, as illustrated in FIG. 3A, the conductor 50 is provided on the side of the base end of the pipe 30A of the nozzle unit 30. The conductor 50 is formed of, for example, polytetrafluoroethylene (PTFE) containing kneaded carbon, so that the entirety of the conductor 50 is conductive. In this case, both the second layer 32 and the third layer 33 of the pipe 30A extend to the side of the base end and terminate in the conductor 50. In addition, the first layer 31 is exposed to the outside from the inside of the conductor 50, and the conductive outer surface of the first layer 31 is in electrical conduction with the conductor 50.

Further, the third layer 33 extends to and terminates at the left-hand side of the installation member 50a within the conductor 50, and the second layer 32 is exposed in the conductor 50 and is in electrical conduction with the conductor 50. The second layer 32 extends to and terminates at the right-hand side of the installation member 50a within the conductor 50.

The first layer 31 of the pipe 30A penetrates the conductor 50 and extends toward the side of the base end (the right-hand side of FIG. 3A) of the pipe 30A. The first layer 31 extends to the right-hand side of the installation member 50a within the conductor 50, and ends at the same position as that of the second layer 32.

In addition, the additional first layer 31A is inserted at the end of the conductor 50 on the right-hand side, and the joint 51 is attached to the end of the additional first layer 31A on the right-hand side. The joint 51 is formed of, for example, a conductive PFA material. Specifically, the joint 51 may use, for example, an AS-type PFA tube having conductive inner and outer surfaces as illustrated in FIG. 5B, or a PTFE tube containing kneaded carbon so that the entirety thereof is conductive. On the other hand, in the nozzle support 25, a communication tube 52 having a structure similar to that of the conductive additional first layer 31A is provided. The communication tube 52 is formed of an NE-type PFA tube having a conductive outer surface. The additional first layer 31A and the communication tube 52 are clamped from the outside by the joint 51 having the conductive inner and outer surfaces so that the interior of the additional first layer 31A and the interior of the communication tube 52 are in communication with each other. In this case, the first layer 31 and the communication tube 52 are also in electrical conduction with each other via the joint 51. The communication tube 52 in the nozzle support 25 having the above-described configuration is grounded via a conductive line (not illustrated).

In addition, as illustrated in FIG. 3B, at the side of the tip end of the pipe 30A, the third layer 33 completely covers the first layer 31 and the second layer 32 from the outside, and also covers a portion of the nozzle tip 40 from the outside. The third layer 33 has high chemical resistance and heat resistance. Thus, the first layer 31, the second layer 32, and the nozzle tip 40 can be effectively protected from, for example, the processing liquid containing the high-temperature SPM, by the third layer 33 having high chemical resistance and heat resistance.

Figure 7:
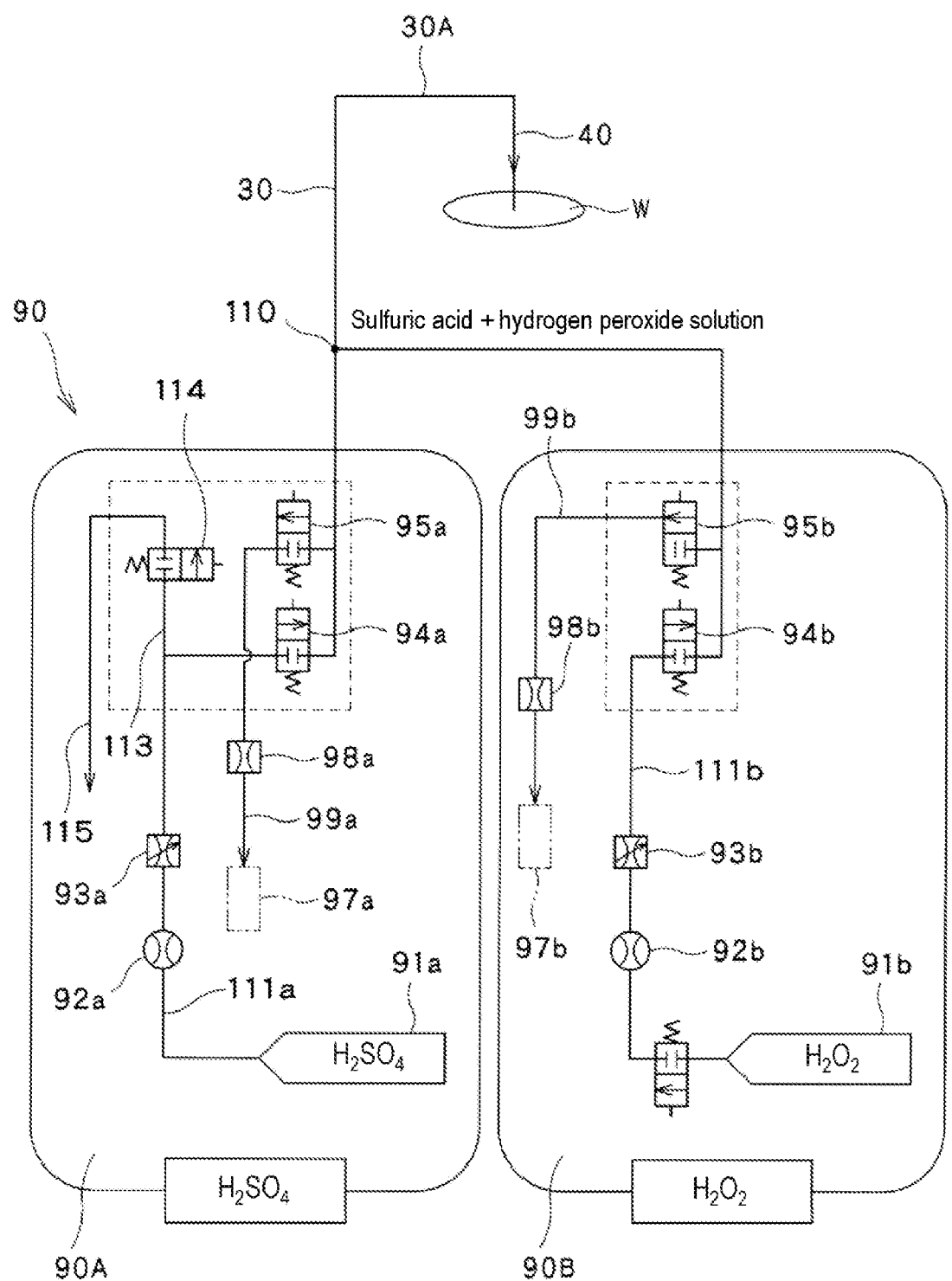
FIG. 7 is a view illustrating the nozzle unit and a processing liquid supply system.

Next, a processing liquid supply system 90 configured to supply the processing liquid to the nozzle unit 30 will be described with reference to FIG. 7. In the present embodiment, a sulfuric acid hydrogen peroxide mixture (SPM), which is a mixed liquid of sulfuric acid and hydrogen peroxide solution, is supplied from the processing liquid supply system 90 to the nozzle unit 30.

The processing liquid supply system 90 includes a sulfuric acid supply system 90A and a hydrogen peroxide solution supply system 90B. The sulfuric acid supply system 90A has a sulfuric acid source 91$a$, and a flow meter 92$a$ and a needle valve 93$a$, which are sequentially connected to the sulfuric acid source 91$a$ via a supply line 111$a$.

In addition, an opening and closing valve 94$a$ is connected to the downstream side of the needle valve 93$a$, and a joining point 110 of sulfuric acid and hydrogen peroxide solution is connected to the downstream side of the opening and closing valve 94$a$.

A drain line 99$a$ is branched from and connected to a side of an outlet of the opening and closing valve 94$a$, and a drain valve 95$a$ and a flow meter 98$a$ are installed in the drain line 99$a$.

In addition, a suction device 97$a$ may be installed at a tip end of the drain line 99$a$.

Further, a branch line 113 is branched from and connected to the supply line 111$a$ on the downstream side of the needle valve 93$a$, and a return line 115 configured to return sulfuric acid to the sulfuric acid source 91$a$ via a circulation valve 114 is connected to the branch line 113.

The hydrogen peroxide solution supply system 90B includes a hydrogen peroxide solution source 91$b$, and a flow meter 92$b$ and a needle valve 93$b$, which are sequentially connected to the hydrogen peroxide solution source 91$b$ via a supply line 111$b$.

An opening and closing valve 94$b$ is connected to the downstream side of the needle valve 93$b$, and the joining point 110 of sulfuric acid and hydrogen peroxide solution is connected to the downstream side of the opening and closing valve 94$b$.

A drain line 99$b$ is branched from and connected to a side of an outlet of the opening and closing valve 94$b$, and a drain valve 95$b$ and a flow meter 98$b$ are installed in the drain line 99$b$.

In addition, a suction device 97$b$ may be installed at a tip end of the drain line 99$a$.

Next, operations of the present embodiment having the configuration described above, that is, a substrate processing method, will be described.

First, as illustrated in FIG. 2, the wafer W is held by the substrate holding mechanism 22 in the processing unit (the substrate processing apparatus according to the present disclosure) 16. Next, the wafer W held by the substrate holding mechanism 22 is rotated by the substrate holding mechanism 22, and during the rotation of the wafer W, the processing liquid consisting of, for example, the SPM, is ejected from the nozzle tip 40 of the nozzle unit 30 to the wafer W.

During this period, the processing liquid scattered to the outside of the wafer W due to the centrifugal force accompanying the rotation of the wafer W is received and recovered by the recovery cup 23.

Next, operations of the nozzle unit 30 during the period described above will be described with reference to FIGS. 8A to 8D and FIG. 9.

The nozzle unit 30 is driven and controlled by the control device 4 configured to control the substrate processing apparatus 16. First, the control device 4 opens the opening and closing valve 94$a$ of the sulfuric acid supply system 90A and the opening and closing valve 94$b$ of the hydrogen peroxide solution supply system 90B, and rotates the wafer W. In this case, the nozzle unit 30 is arranged in advance above the wafer W, and the sulfuric acid supplied from the sulfuric acid source 91$a$ and the hydrogen peroxide solution supplied from the hydrogen peroxide solution source 91$b$ join at the joining point 110. Thus, the SPM is formed and sent to the nozzle unit 30. Thereafter, the processing liquid (SPM) is ejected from the nozzle tip 40 of the nozzle unit 30 to the wafer W (see FIG. 8A).

Subsequently, after completing the processing using the SPM, the control device 4 closes the opening and closing valve 94$a$ of the sulfuric acid supply system 90A and the opening and closing valve 94$b$ of the hydrogen peroxide solution supply system 90B, and at the same time, opens the drain valve 95$a$ of the sulfuric acid supply system 90A and the drain valve 95$b$ of the hydrogen peroxide solution supply system 90B.

Figure 8A:
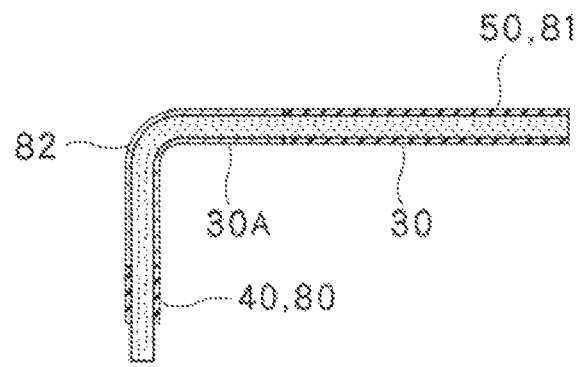
FIG. 8A is a view illustrating an operation of the nozzle unit.
Figure 8B:
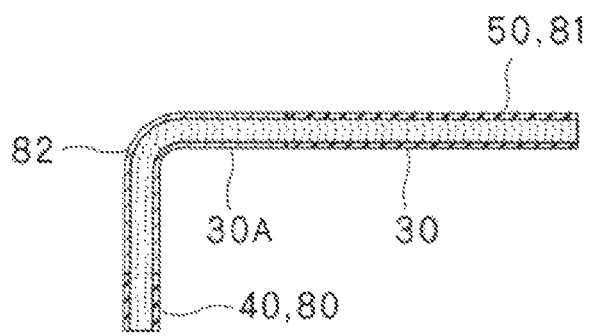
FIG. 8B is a view illustrating an operation of the nozzle unit.
Figure 8C:
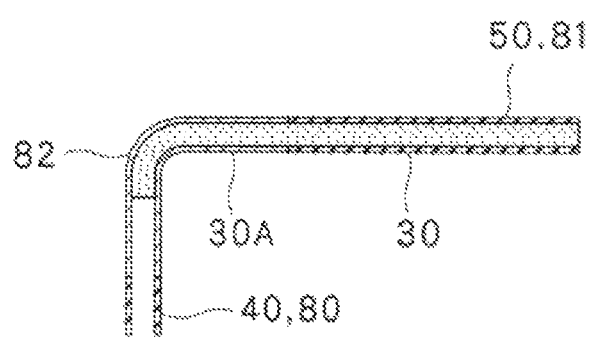
FIG. 8C is a view illustrating an operation of the nozzle unit.

At this time, the ejection of the processing liquid from the nozzle tip 40 of the nozzle unit 30 to the wafer W is stopped (also referred to as "liquid cut") (see FIG. 8B). In addition, by opening the drain valves 95$a$ and 95$b$, the processing liquid, which has reached the tip end of the nozzle tip 40 in the nozzle unit 30, is retracted to the side of the base end (see FIG. 8C).

In this case, by opening the drain valves 95$a$ and 95$b$, in the sulfuric acid supply system 90A, the sulfuric acid in the supply line 111$a$ is discharged to the outside via the drain line 99$a$ by its own weight. In the hydrogen peroxide solution supply system 90B, the hydrogen peroxide solution in the supply line 111$b$ is discharged to the outside via the drain line 99$b$ by its own weight. As a result, the processing liquid is retracted to the side of the base end in the nozzle unit 30 (see FIG. 8C), and by continuing to open the drain valves 95$a$ and 95$b$, the processing liquid is retracted to a reference position P in the nozzle unit 30 (see FIG. 8D).

Figure 8D:
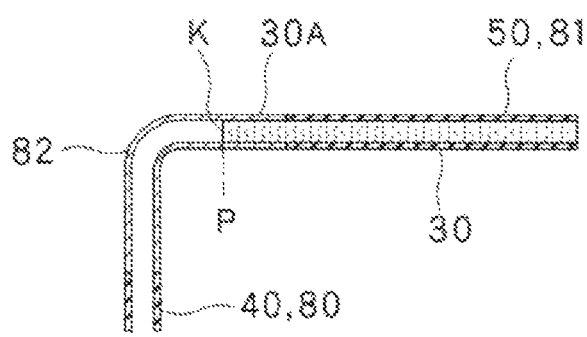
FIG. 8D is a view illustrating an operation of the nozzle unit.
Figure 9:
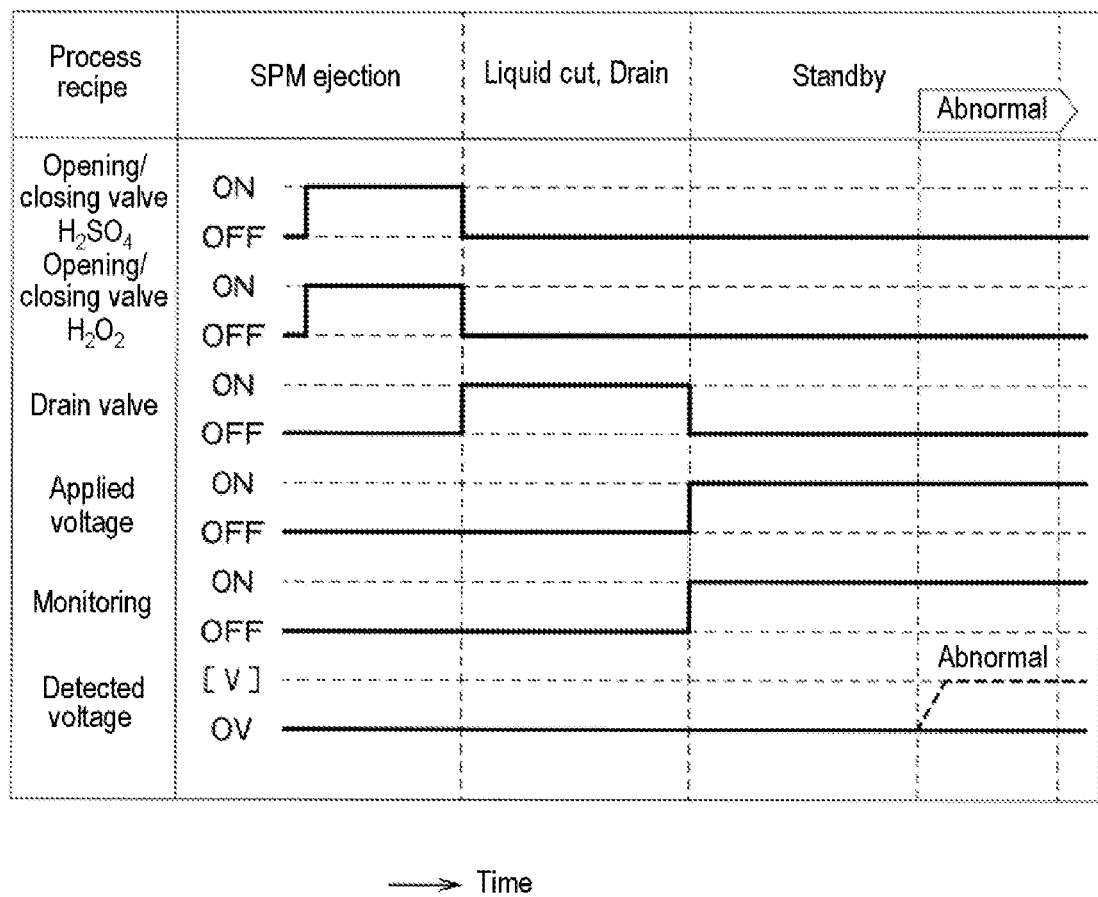
FIG. 9 is a diagram showing operations of the nozzle unit over time.

At this time, as illustrated in FIG. 8D, in the nozzle unit 30, an interface K of the processing liquid is retracted to the reference position P in the nozzle unit 30.

Thereafter, the control device 4 closes the drain valves 95$a$ and 95$b$, and turns the nozzle unit 30 located above the wafer W around the nozzle support 25 so as to bring the nozzle unit 30 from a position above the wafer W to a standby position.

Subsequently, the control device 4 determines whether or not the processing liquid in the nozzle unit 30 located at the standby position is correctly retracted to the reference position. In this case, after closing the drain valves 95$a$ and 95$b$, the control device 4 operates the voltage application part 70 so as to apply a voltage to the nozzle tip 40, which functions as the conductive part 80 for voltage application.

At the same time, a voltage of the conductor 50 is detected by the voltage detector 75 connected to the conductor 50 which functions as the voltage detection part 81, and the voltage detected by the voltage detector 75 is monitored continuously. The voltage detector 75 connected to the conductor 50 is grounded.

As described above, between the conductive nozzle tip 40 functioning as the voltage application conductive part 80 and the conductive conductor 50 functioning as the voltage detection part 81, the non-conductive part 82 that includes the first layer 31 having a non-conductive inner surface brought into contact with the processing liquid is interposed. Therefore, when the interface K of the processing liquid in the nozzle unit 30 is correctly retracted to the predetermined reference position P, the nozzle tip 40 and the conductor 50 are not in electrical conduction with each other, and thus the voltage detected by the voltage detector 75 becomes zero.

Meanwhile, it is also conceivable that the processing liquid in the nozzle unit 30 is sent to the side of the nozzle tip 40 due to, for example, malfunction of both or one of the opening and closing valves 94a and 94b.

In this case, the nozzle tip 40 and the conductor 50 are in electrical conduction with each other via the processing liquid in the nozzle unit 30, and thus the voltage of the conductor 50 is detected by the voltage detector 75. Subsequently, a signal from the voltage detector 75 is sent to the control device 4, and the control device 4 determines that the processing liquid in the nozzle unit 30 reaches the nozzle tip 40 from the predetermined reference position P. In this way, the control device 4 can reliably detect abnormality in the processing liquid supply system 90 of the substrate processing apparatus 16.

As described above, according to the present embodiment, it is possible to easily and reliably detect abnormality in the processing liquid supply system 90 installed on the upstream side of the nozzle unit 30. In this case, simply by providing the voltage application part 70 on the nozzle tip 40 and installing the voltage detector 75 on the conductor 50, it is possible to detect abnormality in the processing liquid supply system 90 inexpensively and reliably using a simple structure.

As described above, according to the present embodiment, abnormality in the processing liquid supply system 90 installed on the upstream side of the nozzle unit 30 can be easily detected. Therefore, it is possible to perform repairs including a recovery operation of the processing liquid supply system, and thus it is possible to reliably prevent the processing liquid from being inadvertently ejected from the nozzle unit 30 toward the wafer W in a subsequent process.

When the processing liquid is ejected from the nozzle tip 40 of the nozzle unit 30 to the wafer W, the processing liquid may be charged and therefore carry an electric charge.

According to the present embodiment, since the inner surface of the nozzle tip 40 is conductive, the electric charge in the processing liquid passing through the nozzle tip 40 is discharged to the inner surface of the nozzle tip 40.

Subsequently, the electric charge discharged to the inner surface of the nozzle tip 40 is discharged to the outside via the following two conductive routes (1) and (2) and the electricity is appropriately removed.

(1) The electric charge discharged to the conductive inner surface of the nozzle tip 40 flows to the conductive outer surface of the nozzle tip 40, and then flows from the outer surface of the nozzle tip 40 to the conductor 50 via the second layer 32. Subsequently, the electric charge flowing to the conductor 50 reaches the outer surface of the additional first layer 31A, then flows outward from the nozzle support 25 via the joint 51, and is grounded. In this way, the electric charge in the processing liquid is appropriately removed.

(2) The electric charge discharged to the conductive inner surface of the nozzle tip 40 flows to the conductive outer surface of the nozzle tip 40. Thereafter, the electric charge reaches the conductor 50 from the outer surface of the nozzle tip 40 via the conductive outer surface of the first layer 31, then passes from the conductor 50 through the additional first layer 31A, and flows to the outside from the nozzle support 25 via the joint 51. Thus, the electric charge in the processing liquid is appropriately removed.

Second Embodiment

Next, a second embodiment of the substrate processing apparatus according to the present disclosure will be described with reference to FIGS. 10 to 12.

Figure 10:
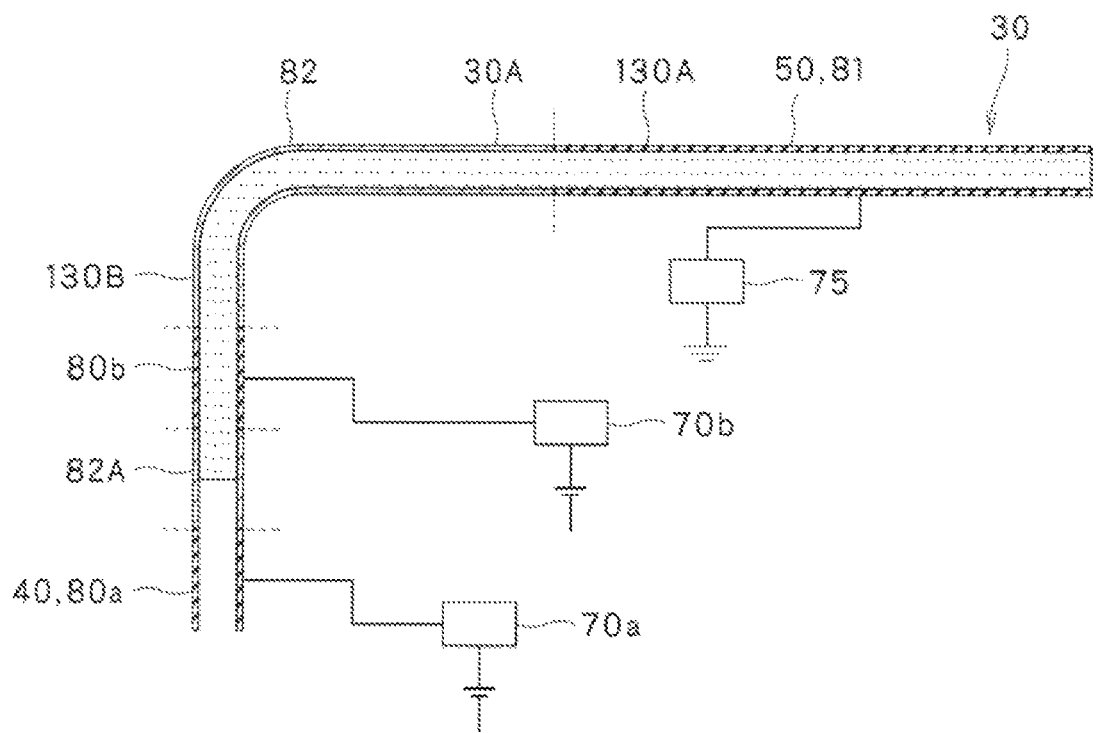
FIG. 10 is a view illustrating a nozzle unit of a substrate processing system according to a second embodiment.
Figure 11A:
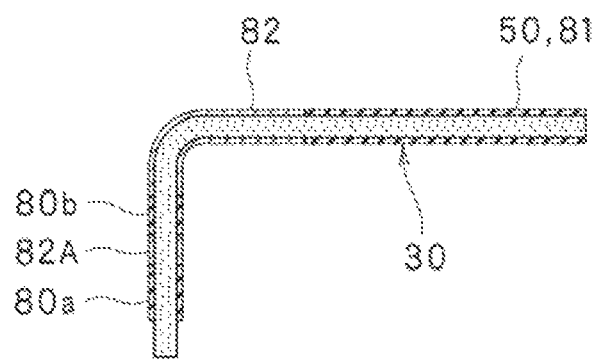
FIG. 11A is a view illustrating an operation of the nozzle unit.
Figure 11B:
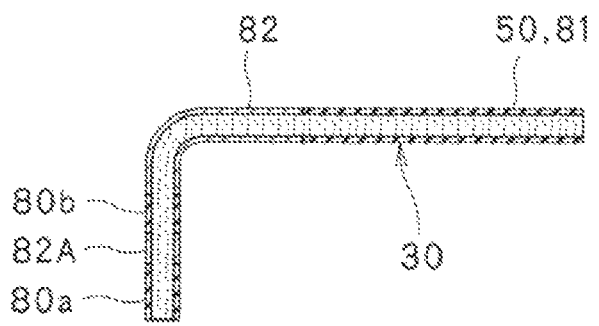
FIG. 11B is a view illustrating an operation of the nozzle unit.
Figure 11C:
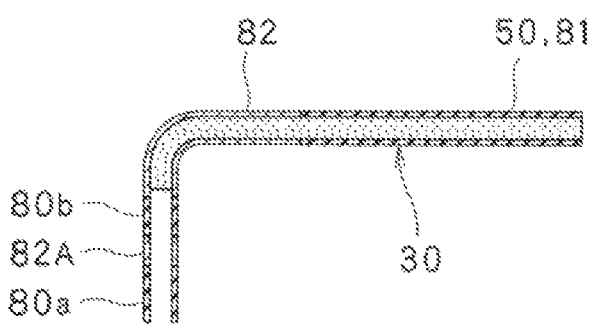
FIG. 11C is a view illustrating an operation of the nozzle unit.
Figure 11D:
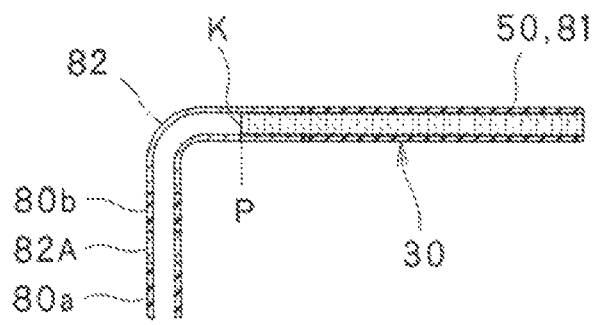
FIG. 11D is a view illustrating an operation of the nozzle unit.
Figure 12:
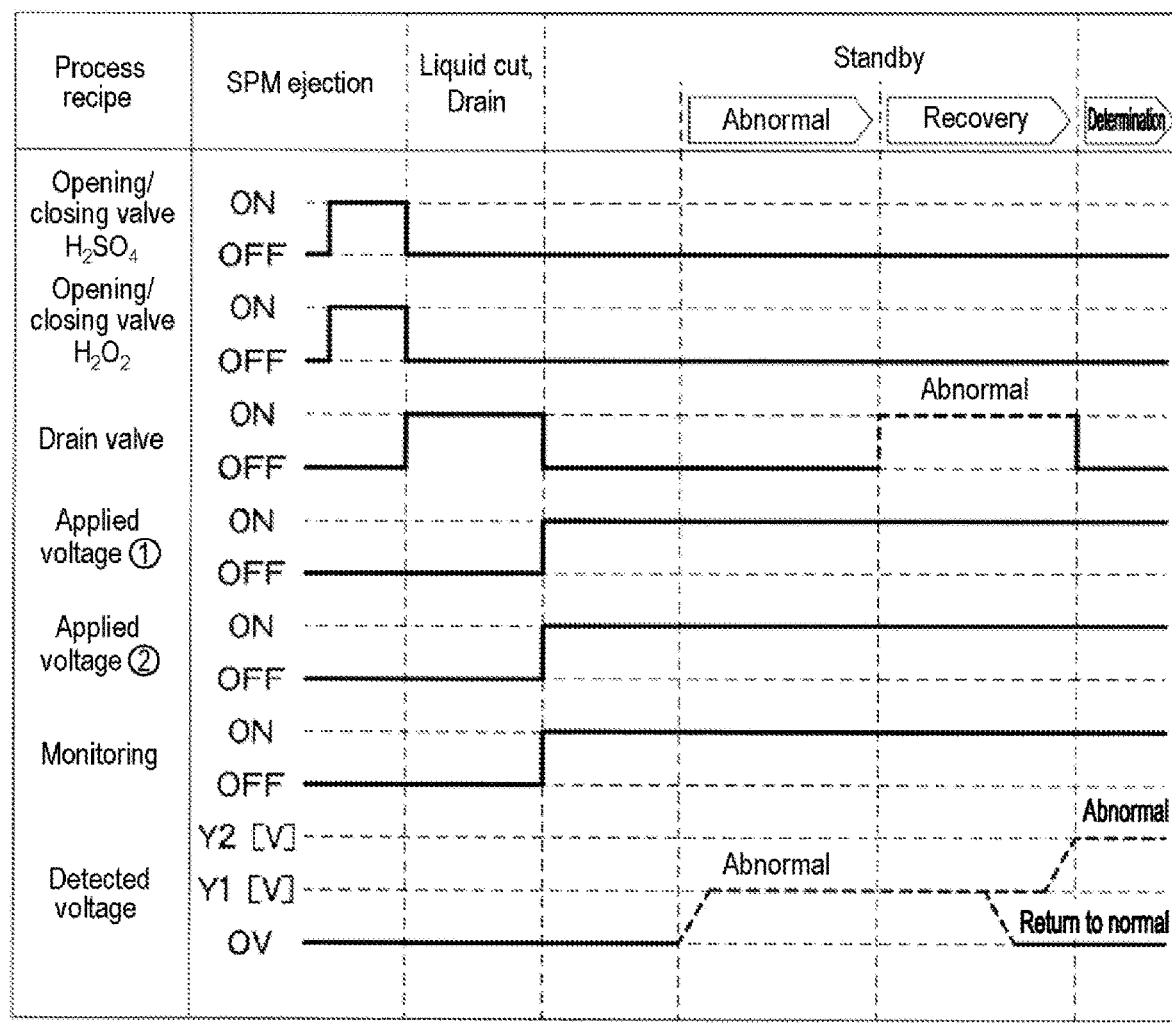
FIG. 12 is a diagram showing operations of the nozzle unit over time.

In the second embodiment illustrated in FIGS. 10 to 12, the voltage application conductive part 80 provided in the nozzle unit 30 includes a plurality of, for example, two, conductive part elements 80a and 80b for voltage application, and voltage application parts 70a and 70b are individually connected to the conductive part elements 80a and 80b, respectively, for voltage application. Further, each of the voltage application parts 70a and 70b is grounded.

Among the components described above, the first conductive part element 80a for voltage application disposed on the side of the tip end includes the nozzle tip 40 of the nozzle unit 30. In addition, the second conductive part element 80b for voltage application is formed of a conductor interposed in the nozzle unit 30, and the conductor may be configured by, for example, polytetrafluoroethylene (PTFE) containing kneaded carbon so that the entirety thereof is conductive. The nozzle unit 30 has a pipe 30A including a horizontal portion 130A and a vertical portion 130B, and the conductive part elements 80a and 80b for voltage application are located on the vertical portion 130B.

In the second embodiment illustrated in FIGS. 10 to 12, the other configurations are substantially the same as those of the first embodiment illustrated in FIGS. 1 to 9.

In the second embodiment illustrated in FIGS. 10 to 12, the same parts as those of the first embodiment illustrated in FIGS. 1 to 9 are denoted by the same reference numerals, and a detailed description thereof will be omitted.

Next, operations of the nozzle unit 30 will be described with reference to FIGS. 10 to 12.

The nozzle unit 30 is driven and controlled by the control device 4 configured to control the substrate processing apparatus 16. First, the control device 4 opens the opening and closing valve 94a of the sulfuric acid supply system 90A and the opening and closing valve 94b of the hydrogen peroxide solution supply system 90B, and rotates the wafer W. In this case, the nozzle unit 30 is arranged in advance above the wafer W, and the sulfuric acid supplied from the sulfuric acid source 91a and the hydrogen peroxide solution supplied from the hydrogen peroxide solution source 91b join at the joining point 110. Thus, the SPM is formed and sent to the nozzle unit 30. Thereafter, the processing liquid (SPM) is ejected from the nozzle tip 40 of the nozzle unit 30 to the wafer W (see FIG. 11A).

Subsequently, after completing the processing using the SPM, the control device 4 closes the opening and closing valve 94a of the sulfuric acid supply system 90A and the opening and closing valve 94b of the hydrogen peroxide solution supply system 90B, and at the same time, opens the drain valve 95*a* of the sulfuric acid supply system 90A and the drain valve 95*b* of the hydrogen peroxide solution supply system 90B.

At this time, the ejection of the processing liquid from the nozzle tip 40 of the nozzle unit 30 to the wafer W is stopped (also referred to as "liquid cut") (see FIG. 11B). In addition, by opening the drain valves 95*a* and 95*b*, the processing liquid, which has reached the tip end of the nozzle tip 40 in the nozzle unit 30, is retracted to the side of the base end (see FIG. 11C).

In this case, by opening the drain valves 95*a* and 95*b*, in the sulfuric acid supply system 90A, the sulfuric acid in the supply line 111*a* is discharged to the outside via the drain line 99*a* by its own weight. In addition, in the hydrogen peroxide solution supply system 90B, the hydrogen peroxide solution in the supply line 111*b* is discharged to the outside via the drain line 99*b* by its own weight. As a result, the processing liquid is retracted to the side of the base end in the nozzle unit 30 (see FIG. 11C). Further, by opening the drain valves 95*a* and 95*b* continuously, the processing liquid is retracted to the reference position P in the nozzle unit 30 (see FIG. 11D).

At this time, as illustrated in FIG. 11D, in the nozzle unit 30, the interface K of the processing liquid is retracted to the reference position P of the nozzle unit 30.

Thereafter, the control device 4 closes the drain valves 95*a* and 95*b*, and turns the nozzle unit 30 located over the wafer W around the nozzle support 25 so as to bring the nozzle unit 30 from the position over the wafer W to the standby position.

Subsequently, the control device 4 determines whether or not the processing liquid in the nozzle unit 30 located at the standby position is correctly retracted to the reference position. In this case, after closing the drain valves 95*a* and 95*b*, the control device 4 operates the two voltage application parts 70*a* and 70*b* so as to apply voltages to the two conductive part elements 80*a* and 80*b*, respectively, for voltage application.

At the same time, the voltage of the conductor 50 is detected by the voltage detector 75 connected to the conductor 50 which functions as the voltage detection part 81, and the voltage detected by the voltage detector 75 is monitored continuously. The voltage detector 75 connected to the conductor 50 is grounded.

Between the conductive nozzle tip 40 functioning as the first conductive part element 80*a* for voltage application and the second conductive part element 80*b* for voltage application, an additional non-conductive part 82A that includes the first layer 31 having the non-conductive inner surface brought into contact with the processing liquid is interposed. In addition, between the second conductive part element 80*b* for voltage application and the conductive conductor 50 functioning as the voltage detection part 81, the non-conductive part 82 that includes the first layer 31 having the non-conductive inner surface brought into contact with the processing liquid is interposed. Therefore, when the interface K of the processing liquid in the nozzle unit 30 is correctly retracted to the predetermined reference position P, the conductive part elements 80*a* and 80*b* for voltage application and the conductor 50 are not in electrical conduction with one another, and thus the voltage detected by the voltage detector 75 becomes zero.

Meanwhile, the processing liquid in the nozzle unit 30 may be sent to the side of the nozzle tip 40 due to, for example, malfunction of both or one of the opening and closing valves 94*a* and 94*b*.

In this case, the processing liquid in the nozzle unit 30 first reaches the second conductive part element 80*b* for voltage application, and the second conductive part element 80*b* for voltage application and the conductor 50 are in electrical conduction with each other via the processing liquid. As a result, the voltage detector 75 detects the voltage of the conductor 50.

At this time, the voltage detector 75 detects a voltage Y1 applied from the voltage application part 70*b* to the second conductive part element 80*b* for voltage application.

At this time, the control device 4 determines that the processing liquid supply system 90 of the nozzle unit 30 is abnormal, and causes the processing liquid supply system 90 to execute a recovery operation.

Specifically, the control device 4 opens the drain valves 95*a* and 95*b* of the processing liquid supply system 90 so as to discharge sulfuric acid and hydrogen peroxide solution to the outside and cause the processing liquid in the nozzle unit 30 to be retreated to the side of the base end of the nozzle unit 30.

When the voltage value detected by the voltage detector 75 becomes zero by performing the recovery operation, the control device 4 determines that the interface K of the processing liquid in the nozzle unit 30 is retracted to the desired reference position P, that is, returns to a normal state, and closes the drain valves 95*a* and 95*b* to terminate the recovery operation.

Meanwhile, despite the recovery operation described above, the processing liquid in the nozzle unit 30 may further reach the first conductive part element 80*a* for voltage application from the second conductive part element 80*b* for voltage application. In this case, the processing liquid causes the first conductive part element 80*a* for voltage application and the second conductive part element 80*b* voltage application to be in electrical conduction with the conductor 50. At this time, the voltage detector 75 detects a voltage Y2 obtained by summing the voltage applied from the voltage application part 70*a* to the first conductive part element 80*a* for voltage application and the voltage applied from the voltage application part 70*b* to the second conductive part element 80*b* for voltage application.

When the processing liquid in the nozzle unit 30 reaches the first conductive part element 80*a* for voltage application as described above, the control device 4 determines that the processing liquid supply system 90 is abnormal, and closes the drain valves 95*a* and 95*b* to terminate the recovery operation. At the same time, the control device 4 issues an external alarm via an alarm device 4*a* to notify of abnormality in the processing liquid supply system 90.

As described above, according to the present embodiment, it is possible to easily and reliably detect abnormality in the processing liquid supply system 90 installed at the upstream side of the nozzle unit 30. In addition, after detecting the abnormality in the processing liquid supply system 90, it is possible to perform the recovery operation on the processing liquid supply system 90 so as to restore the processing liquid supply system 90 to the normal state.

As described above, it is possible to detect the abnormality in the processing liquid supply system 90 installed at the upstream side of the nozzle unit 30. Therefore, it is possible to perform repairs on the processing liquid supply system, and thus it is possible to reliably prevent the processing liquid from being inadvertently ejected from the nozzle unit 30 toward the wafer W in a subsequent process.

In the present embodiment, an example has been described in which, when the control device 4 performs the recovery operation, the drain valves 95*a* and 95*b* are opened to cause the processing liquid in the nozzle unit 30 to be retracted to the side of the base end. However, the present disclosure is not limited thereto, and the control device 4 may operate the suction devices 97a and 97b provided at the tip ends of the drain lines 99a and 99b, respectively, in addition to opening the drain valves 95a and 95b. In this case, it is possible to cause the processing liquid in the nozzle unit 30 to be retracted to the side of the base end of the nozzle unit 30 by its own weight, and to forcibly cause the processing fluid in the nozzle unit 30 to be retracted to the side of the base end by the suction devices 97a and 97b.

Further, when the control device 4 performs the recovery operation, the control device 4 may perform the recovery operation by performing a gas purge using $N_2$ gas for the processing liquid supply system 90 so as to discharge foreign substances or the like in the processing liquid supply system 90 to the outside, instead of opening the drain valves 95a and 95b or operating the suction devices 97a and 97b.

Third Embodiment

Next, a third embodiment of the substrate processing apparatus according to the present disclosure will be described with reference to FIGS. 13 and 14.

Figure 13:
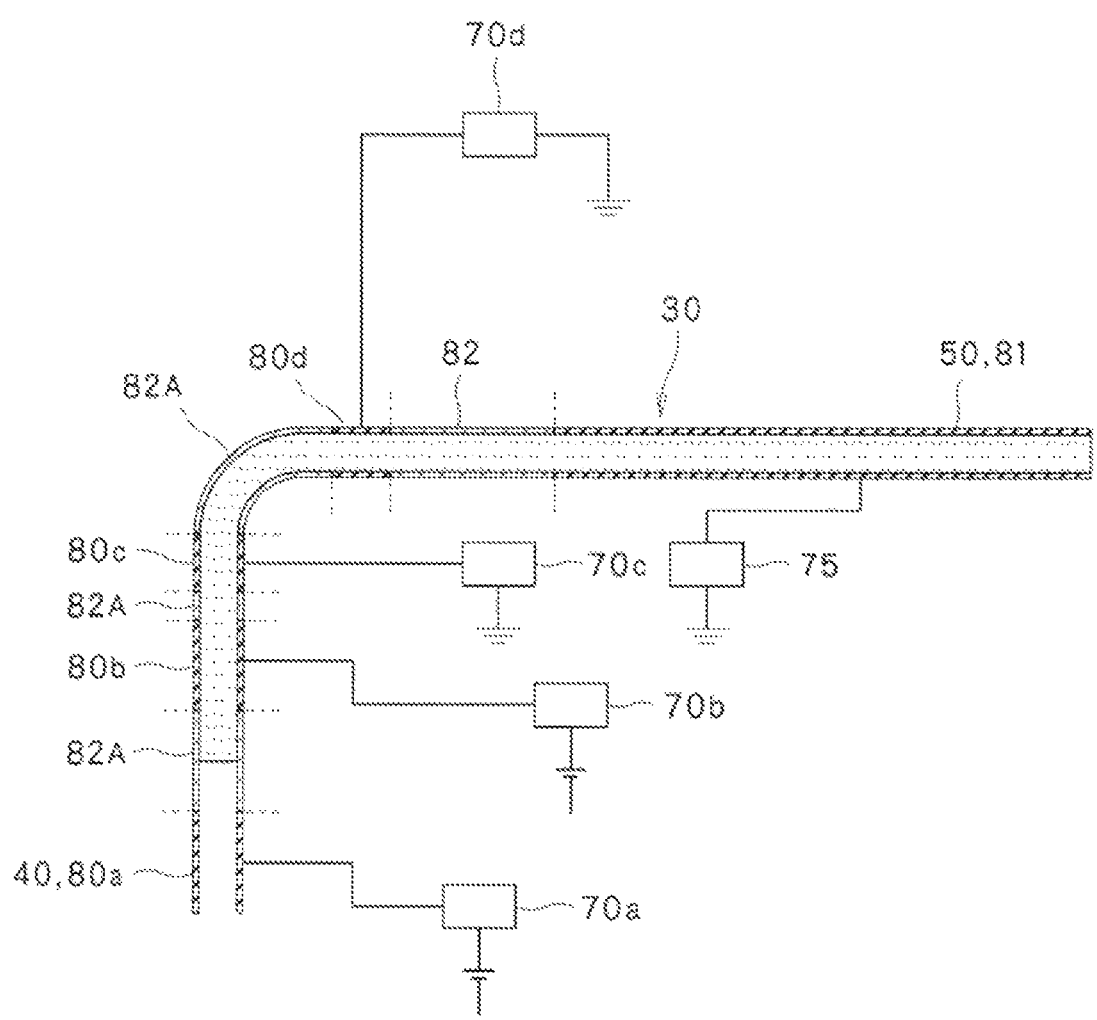
FIG. 13 is a view showing a nozzle unit of a substrate processing apparatus according to a third embodiment.
Figure 14:
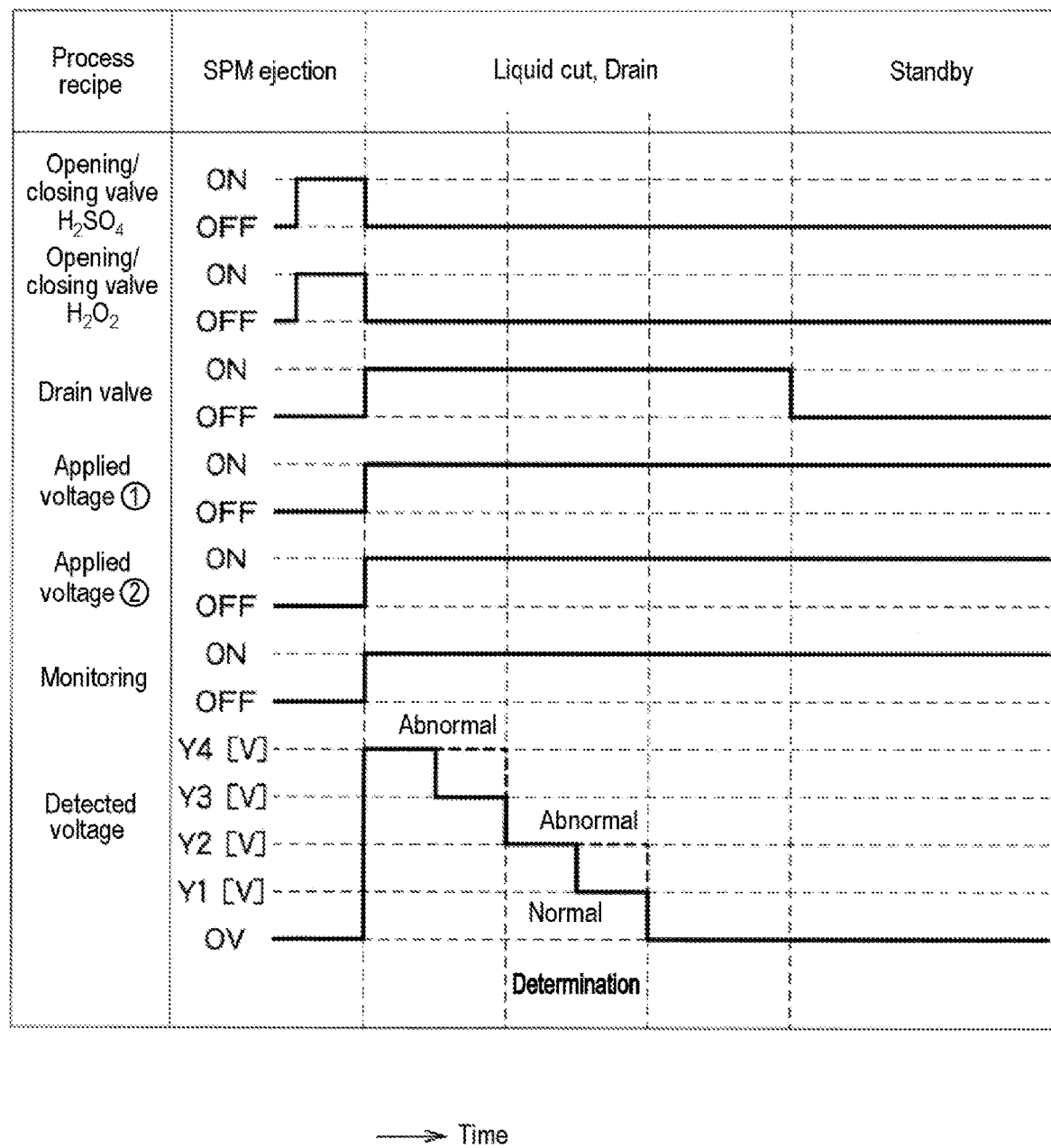
FIG. 14 is a view illustrating operations of the nozzle unit over time.

In the third embodiment illustrated in FIGS. 13 and 14, the conductive part 80 for voltage application provided in the nozzle unit 30 includes a plurality of, for example, four, conductive part elements 80a, 80b, 80c, and 80d for voltage application, and voltage application parts 70a, 70b, 70c, and 70d are individually connected to the conductive part elements 80a, 80b, 80c, and 80d, respectively, for voltage application. Further, each of the voltage application parts 70a, 70b, 70c, and 70d is grounded.

Among the components described above, the first conductive part element 80a for voltage application disposed on the side of the tip end includes the nozzle tip 40 of the nozzle unit 30. In addition, each of the second conductive part element 80b for voltage application, the third conductive part element 80c for voltage application, and the fourth part element 80d for voltage application may be formed of a conductor interposed in the nozzle unit 30, and the conductor may be configured by, for example, polytetrafluoroethylene (PTFE) containing kneaded carbon so that the entirety thereof is conductive. The nozzle unit 30 has a pipe 30A that includes a horizontal portion 130A and a vertical portion 130B.

In addition, additional non-conductive parts 82A are provided between the first conductive part element 80a for voltage application and the second conductive part element 80b for voltage application, between the second conductive part element 80b for voltage application and the third conductive part element 80c for voltage application, and between the third conductive part element 80c for voltage application and the fourth conductive part element 80d for voltage application, respectively. Further, a non-conductive part 82 is provided between the fourth conductive part element 80d for voltage application and the voltage detection part 81, and lengths of each of the additional non-conductive parts 82A and the non-conductive part 82, that is, positions of the first to fourth conductive part elements 80a to 80d for voltage application, are obtained in advance.

In the third embodiment illustrated in FIGS. 13 and 14, the other configurations are substantially the same as those of the first embodiment illustrated in FIGS. 1 to 9.

In the third embodiment illustrated in FIGS. 13 and 14, the same parts as those of the first embodiment illustrated in FIGS. 1 to 9 are denoted by the same reference numerals, and a detailed description thereof will be omitted.

Next, operations of the nozzle unit 30 will be described with reference to FIGS. 13 and 14.

The nozzle unit 30 is driven and controlled by the control device 4 configured to control the substrate processing apparatus 16. First, the control device 4 opens the opening and closing valve 94a of the sulfuric acid supply system 90A and the opening and closing valve 94b of the hydrogen peroxide solution supply system 90B, and rotates the wafer W. In this case, the nozzle unit 30 is arranged in advance above the wafer W, and the sulfuric acid supplied from the sulfuric acid source 91a and the hydrogen peroxide solution supplied from the hydrogen peroxide solution source 91b join at the joining point 110. Thus, the SPM is formed and sent to the nozzle unit 30. Thereafter, the processing liquid (SPM) is ejected from the nozzle tip 40 of the nozzle unit 30 to the wafer W.

Subsequently, after completing the processing using the SPM, the control device 4 closes the opening and closing valve 94a of the sulfuric acid supply system 90A and the opening and closing valve 94b of the hydrogen peroxide solution supply system 90B, and at the same time, opens the drain valve 95a of the sulfuric acid supply system 90A and the drain valve 95b of the hydrogen peroxide solution supply system 90B.

At this time, the ejection of the processing liquid from the nozzle tip 40 of the nozzle unit 30 to the wafer W is stopped (also referred to as "liquid cut"). In addition, by opening the drain valves 95a and 95b, the processing liquid, which has reached the tip end of the nozzle tip 40 in the nozzle unit 30, is retracted to the side of the base end.

In this case, by opening the drain valves 95a and 95b, in the sulfuric acid supply system 90A, the sulfuric acid in the supply line 111a is discharged to the outside via the drain line 99a by its own weight. In addition, in the hydrogen peroxide solution supply system 90B, the hydrogen peroxide solution in the supply line 111b is discharged to the outside via the drain line 99b by its own weight. As a result, the processing liquid is retracted to the side of the base end in the nozzle unit 30, and by opening the drain valves 95a and 95b continuously, the processing liquid is retracted to the reference position P in the nozzle unit 30.

At this time, in the nozzle unit 30, the interface of the processing liquid is retracted to the reference position of the nozzle unit 30.

Thereafter, the control device 4 closes the drain valves 95a and 95b, and turns the nozzle unit 30 located over the wafer W around the nozzle support 25 so as to bring the nozzle unit 30 from the position over the wafer W to the standby position.

During this period, the control device 4 determines whether or not the operation of draining the processing liquid executed by opening the drain valves 95a and 95b is performed appropriately.

Specifically, after closing the drain valves 95a and 95b, the control device 4 operates the voltage application parts 70a to 70d, and applies voltages to the first to fourth conductive part elements 80a to 80d for voltage application.

At the same time, the voltage of the conductor 50 is detected by the voltage detector 75 connected to the conductor 50 which functions as the voltage detection part 81, and the voltage detected by the voltage detector 75 is monitored continuously. The voltage detector 75 connected to the conductor 50 is grounded.

The additional non-conductive parts 82A, each of which includes the first layer 31 having the non-conductive inner surface brought into contact with the processing liquid, are interposed between two adjacent ones among the first to fourth conductive part elements 80$a$ to 80$d$ for voltage application of the conductive part 80 for voltage application, respectively. In addition, between the fourth conductive part element 80$d$ for voltage application and the conductive conductor 50 functioning as the voltage detection part 81, the non-conductive part 82 that includes the first layer 31 having the non-conductive inner surface brought into contact with the processing liquid is interposed.

Therefore, while the interface K of the processing liquid in the nozzle unit 30 is retracted in the nozzle unit 30 during the draining operation, a moving speed of the interface of the processing liquid in the nozzle unit 30 can be obtained by the voltage detector 75.

That is, immediately after closing the drain valves 95$a$ and 95$b$, since the interface of the processing liquid in the nozzle unit 30 is located at the nozzle tip 40 (the first conductive part element 80$a$ for voltage application), the voltage detected by the voltage detector 75 becomes a total value Y4 of the voltages applied from the voltage application parts 70$a$ to 70$d$.

Subsequently, when the interface of the processing liquid in the nozzle unit 30 moves to the side of the base end of the nozzle unit 30 and reaches the second conductive part element 80$b$ for voltage application, the voltage detected by the voltage detector 75 becomes a total value Y3 of the voltages applied from the voltage application parts 70$b$ to 70$d$.

Subsequently, when the interface of the processing liquid in the nozzle unit 30 further moves to the side of the base end of the nozzle unit 30 and reaches the third conductive part element 80$c$ for voltage application, the voltage detected by the voltage detector 75 becomes a total value Y2 of the voltages applied from the voltage application parts 70$c$ and 70$d$.

When the interface of the processing liquid in the nozzle unit 30 further moves to the side of the base end of the nozzle unit 30 and reaches the fourth conductive part element 80$d$ for voltage application, the voltage detected by the voltage detector 75 becomes a value Y1 of the voltage applied from the voltage application part 70$d$.

When the interface of the processing liquid in the nozzle unit 30 further moves to the side of the base end of the nozzle unit 30 and is distanced from the fourth conductive part element 80$d$ for voltage application, the voltage detected by the voltage detector 75 becomes zero.

As described above, the positions of the first to fourth conductive part elements 80$a$ to 80$d$ for voltage application installed in the nozzle unit 30 are obtained in advance, and by detecting the voltages by the voltage detector 75, it is possible to obtain the moving speed of the interface of the processing liquid in the nozzle unit 30, that is, a draining speed, from the voltages detected by the voltage detector 75 and detection times.

In addition, based on the moving speed of the interface of the processing liquid obtained by the voltage detector 75 and a predetermined target moving speed of the interface of the processing liquid, the control device 4 can determine soundness of the draining operation of the processing liquid supply system 90 connected to the nozzle unit 30, that is, whether or not the processing liquid is correctly retracted from the side of the nozzle tip 40 to the side of the base end within the nozzle unit 30.

Further, when it is determined that the draining operation of the processing liquid supply system 90 is insufficient, the processing liquid supply system 90 is repaired by suctioning the processing liquid outward from the interior of the processing liquid supply system 90 by using the suction devices 97$a$ and 97$b$, or by performing a gas purge using $N_2$ gas to discharge the processing liquid to the outside.

Further, in each of the embodiments described above, the conductor 50 is used as the voltage detection part 81 and the voltage detector 75 is connected to the conductor 50 to directly detect the voltage of the conductor 50, but the present disclosure is not limited thereto. The voltage of the voltage detection part 81 may also be indirectly detected by a capacitance-type surface electrometer.

When the voltage of the voltage detection part 81 is indirectly detected by the capacitance-type surface electrometer, the voltage detection part 81 is not necessarily conductive like the conductor 50, and may be formed of a non-conductive member.

In each of the embodiments described above, an example in which the conductor 50 is used as the voltage detection part 81 and the voltage detector 75 is connected to the conductor 50 is illustrated, but the present disclosure is not limited thereto. The conductor 50 may be used as a current detection part 81A, and a current detector (an ammeter) 75A configured to detect a current flowing in the conductor 50 may be connected to the conductor 50 (see FIG. 6). Similarly, an example in which the voltage detector 106 is connected to the voltage detection part 105 is illustrated, but the present disclosure is not limited thereto. A current detection part 105A may be used instead of the voltage detection part 105, and a current detector (an ammeter) 106A configured to detect a current flowing in the current detection part 105A may be connected to the current detection part 105A (see FIG. 6).

According to the present disclosure, it is possible to prevent the processing liquid from being inadvertently ejected from the nozzle unit toward the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
at least one nozzle unit configured to eject a processing liquid to a substrate,
wherein the at least one nozzle unit includes a conductive part for voltage application configured to be brought into contact with the processing liquid, and a voltage detection part or a current detection part configured to be brought into contact with the processing liquid,
wherein a non-conductive part is interposed between the conductive part for voltage application and the voltage detection part or between the conductive part for voltage application and the current detection part, and
wherein a voltage application part is connected to the conductive part for voltage application, and a voltage detector is installed in the voltage detection part or a current detector is installed in the current detection part.

2. The substrate processing apparatus of claim 1, wherein the at least one nozzle unit further includes a pipe configured to supply the processing liquid, and a nozzle tip provided at a tip end of the pipe and configured to eject the processing liquid toward the substrate, and
wherein the nozzle tip functions as the conductive part for voltage application.

3. The substrate processing apparatus of claim 2, wherein the voltage detection part includes a conductive part for voltage detection or the current detection part includes a conductive part for current detection, and wherein the voltage detector is connected to the conductive part for voltage detection to directly detect a voltage of the conductive part for voltage detection, or the current detector is connected to the conductive part for current detection to directly detect a current flowing in the conductive part for current detection.

4. The substrate processing apparatus of claim 2, wherein the voltage detector is formed by a capacitance-type surface electrometer configured to indirectly detect a voltage of the voltage detection part.

5. The substrate processing apparatus of claim 2, further comprising:
a control device configured to determine whether or not the processing liquid is present between the conductive part for voltage application and the voltage detection part or between the conductive part for voltage application and the current detection part based on a signal from the voltage detector or the current detector.

6. The substrate processing apparatus of claim 1, wherein the voltage detection part includes a conductive part for voltage detection or the current detection part includes a conductive part for current detection, and wherein the voltage detector is connected to the conductive part for voltage detection to directly detect a voltage of the conductive part for voltage detection, or the current detector is connected to the conductive part for current detection to directly detect a current flowing in the conductive part for current detection.

7. The substrate processing apparatus of claim 1, wherein the voltage detector is formed by a capacitance-type surface electrometer configured to indirectly detect a voltage of the voltage detection part.

8. The substrate processing apparatus of claim 1, further comprising:
a control device configured to determine whether or not the processing liquid is present between the conductive part for voltage application and the voltage detection part or between the conductive part for voltage application and the current detection part based on a signal from the voltage detector or the current detector.

9. The substrate processing apparatus of claim 8, wherein the conductive part for voltage application includes a plurality of conductive part elements for voltage application with additional non-conductive parts being interposed between adjacent ones among the conductive part elements for voltage application, and
wherein the control device is further configured to obtain an interface of the processing liquid in the at least one nozzle unit based on a signal from the voltage detector or the current detector.

10. The substrate processing apparatus of claim 9, wherein a processing liquid supply system including an opening and closing valve and a drain valve provided at a side of an outlet of the opening and closing valve is connected to an upstream side of the at least one nozzle unit, and a drain line is connected to the drain valve, and
wherein when stopping ejection of the processing liquid, the control device closes the opening and closing valve and opens the drain valve such that the processing liquid is discharged from the drain line, and obtains the interface of the processing liquid based on the signal from the voltage detector or the current detector.

11. The substrate processing apparatus of claim 10, wherein the control device obtains a draining speed of the processing liquid based on the interface of the processing liquid.

12. The substrate processing apparatus of claim 8, wherein a processing liquid supply system including an opening and closing valve and a drain valve provided at a side of an outlet of the opening and closing valve is connected to an upstream side of the at least one nozzle unit, and a drain line is connected to the drain valve, and
wherein the control device closes the opening and closing valve and the drain valve while the substrate processing apparatus is on standby, and opens the drain valve to discharge the processing liquid from the drain line when the processing liquid is determined to be present between the conductive part for voltage application and the voltage detection part or between the conductive part for voltage application and the current detection part.

13. The substrate processing apparatus of claim 1, wherein the at least one nozzle unit is installed with a plurality of nozzle units.

14. A substrate processing method using a substrate processing apparatus that includes a nozzle unit configured to eject a processing liquid to a substrate and a control device, wherein the nozzle unit includes a conductive part for voltage application configured to be brought into contact with the processing liquid, and a voltage detection part or a current detection part configured to be brought into contact with the processing liquid, wherein a non-conductive part is interposed between the conductive part for voltage application and the voltage detection part or between the conductive part for voltage application and the current detection part, wherein a voltage application part is connected to the conductive part for voltage application, and a voltage detector is installed in the voltage detection part or a current detector is installed in the current detection part, and wherein a processing liquid supply system is provided at an upstream side of the nozzle unit, the method comprising:
ejecting the processing liquid from the nozzle unit to the substrate by operating the processing liquid supply system by the control device;
stopping the ejection of the processing liquid from the nozzle unit to the substrate by operating the processing liquid supply system by the control device;
applying a voltage from the voltage application part to the conductive part for voltage application by the control device; and
determining, by the control device, whether or not the processing liquid is present between the conductive part for voltage application and the voltage detection part by detecting a voltage of the voltage detection part by the voltage detector, or determining, by the control device, whether or not the processing liquid is present between the conductive part for voltage application and the current detection part by detecting a current flowing in the current detection part by the current detector.

15. The substrate processing method of claim 14, wherein the conductive part for voltage application includes a plurality of conductive part elements for voltage application with additional non-conductive parts being interposed between adjacent ones among the conductive part elements for voltage application, and wherein the control device is configured to obtain an interface of the processing liquid in the nozzle unit based on a signal from the voltage detector or the current detector.

16. The substrate processing method of claim 14, wherein the processing liquid supply system includes an opening and closing valve and a drain valve provided at a side of an outlet of the opening and closing valve, and a drain line is connected to the drain valve, and wherein the control device closes the opening and closing valve and the drain valve while the substrate processing apparatus is on standby, and opens the drain valve to discharge the processing liquid from the drain line when the processing liquid is determined to be present between the conductive part for voltage application and the voltage detection part or between the conductive part for voltage application and the current detection part.

17. The substrate processing method of claim 14, wherein the processing liquid supply system includes an opening and closing valve and a drain valve provided at a side of an outlet of the opening and closing valve, and a drain line is connected to the drain valve, and wherein in the stopping the ejection of the processing liquid, the control device closes the opening and closing valve and opens the drain valve such that the processing liquid is discharged from the drain line, and obtains an interface of the processing liquid based on a signal from the voltage detector or the current detector.

18. The substrate processing method of claim 17, wherein the control device obtains a draining speed of the processing liquid based on the interface of the processing liquid.

* * * * *